(12) United States Patent
Kamada et al.

(10) Patent No.: US 9,412,607 B2
(45) Date of Patent: Aug. 9, 2016

(54) PLASMA ETCHING METHOD

(71) Applicant: Tokyo Electron Limited, Tokyo (JP)

(72) Inventors: Tomiko Kamada, Miyagi (JP); Akinori Kitamura, Miyagi (JP); Hiroto Ohtake, Miyagi (JP); Yutaka Osada, Miyagi (JP); Yuji Otsuka, Miyagi (JP); Masayuki Kohno, Miyagi (JP); Yusuke Takino, Miyagi (JP); Eiji Suzuki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/271,628

(22) Filed: May 7, 2014

(65) Prior Publication Data

US 2014/0332372 A1    Nov. 13, 2014

(30) Foreign Application Priority Data

May 8, 2013 (JP) ................................ 2013-098762

(51) Int. Cl.
*H01L 21/3065* (2006.01)
*H01L 29/66* (2006.01)
*H01J 37/32* (2006.01)
*H01L 21/02* (2006.01)
*H01L 29/78* (2006.01)

(52) U.S. Cl.
CPC ....... *H01L 21/3065* (2013.01); *H01J 37/32192* (2013.01); *H01L 21/02057* (2013.01); *H01L 29/66636* (2013.01); *H01J 2237/334* (2013.01); *H01L 29/66545* (2013.01); *H01L 29/66628* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 6,235,643 B1* | 5/2001 | Mui ................... | H01L 21/3065 156/345.24 |
| 8,253,204 B2* | 8/2012 | Lee et al. ....................... | 257/368 |
| 2001/0001732 A1* | 5/2001 | Mitsuiki .......... | H01L 21/31116 438/689 |
| 2004/0137750 A1* | 7/2004 | Nemoto et al. ............... | 438/719 |
| 2005/0161435 A1* | 7/2005 | Kobayashi ..................... | 216/72 |
| 2006/0027530 A1* | 2/2006 | Honda et al. .................... | 216/58 |
| 2008/0318407 A1* | 12/2008 | Eun .................... | H01L 27/10855 438/600 |
| 2009/0032880 A1* | 2/2009 | Kawaguchi et al. .......... | 257/369 |
| 2009/0246965 A1* | 10/2009 | Mori ................... | H01J 37/3222 438/719 |
| 2010/0009543 A1* | 1/2010 | Cho .................... | H01L 21/0206 438/735 |
| 2010/0105207 A1* | 4/2010 | Yun ................... | H01L 21/28123 438/694 |
| 2011/0201208 A1* | 8/2011 | Kawakami et al. ........... | 438/714 |

FOREIGN PATENT DOCUMENTS

JP    2006-522486 A    9/2006

* cited by examiner

*Primary Examiner* — Anita Alanko
(74) *Attorney, Agent, or Firm* — Pearne & Gordon LLP

(57) ABSTRACT

An isotropic etching process can be performed with high uniformity. A plasma etching method of etching an etching target layer containing silicon includes preparing a processing target object having the etching target layer in a processing chamber; removing an oxide film on a surface of the etching target layer by generating plasma of a first processing gas that contains a fluorocarbon gas or a fluorohydrocarbon gas but does not contain oxygen; removing a carbon-based reaction product generated when the removing of the oxide film by generating plasma of a second processing gas that does not contain oxygen; and etching the etching target layer without applying a high frequency bias power to a lower electrode serving as a mounting table configured to mount the processing target object thereon by generating plasma of a third processing gas containing a fluorocarbon gas or a fluorohydrocarbon gas with a microwave.

5 Claims, 24 Drawing Sheets

FIG. 20

| | EXPERIMENTAL EXAMPLE 14 (PRESSURE: 20 mT, PROCESSING TIME: 45 sec) | EXPERIMENTAL EXAMPLE 15 (PRESSURE: 100 mT, PROCESSING TIME: 10 sec) | EXPERIMENTAL EXAMPLE 16 (PRESSURE: 200 mT, PROCESSING TIME: 20 sec) |
|---|---|---|---|
| PROFILE | | | |
| L/V (LV RATIO) | 7.9nm/27.3nm (0.29) | 6.2nm/20.25nm (0.30) | 8.6nm/19.8nm (0.43) |

PLASMA ETCHING METHOD

CROSS-REFERENCE TO RELATED APPLICATION

This application claims the benefit of Japanese Patent Application No. 2013-098762 filed on May 8, 2013, the disclosures of which are incorporated herein by reference.

TECHNICAL FIELD

The various embodiments described herein pertain generally to a plasma etching method.

BACKGROUND

In the manufacture of an electronic device such as a semiconductor device or the like, an etching process is performed on an etching target layer of a processing target object. A plasma etching may be used for this etching process. The plasma etching may include an isotropic etching in which an etching progresses in all direction; and an anisotropic etching in which an etching progresses only in a certain direction. The isotropic etching or the anisotropic etching may be selectively performed depending on a required etching shape. In the isotropic etching, since the etching progresses to form a circular arc-shaped cross section, it may be possible to etch an etching target layer such that a part of the etching target layer located under a mask pattern is removed, for example.

A processing method of an etching target layer by performing the isotropic etching is described in Patent Document 1. In Patent Document 1, it is described that a part of a buried oxide film, which serves as an etching target layer located under a fin, is removed and undercut in a horizontal direction through a dry etching process, so that a recess is formed.

Patent Document 1: Japanese Patent Laid-open Publication No. 2006-522486

When etching an etching target layer containing silicon, a breakthrough process for removing a natural oxide film formed on a surface of the silicon as a result of being exposed to the atmosphere needs to be performed as a pre-treatment. In this breakthrough process, fluorine radicals are generated by exciting plasma of a processing gas containing fluorocarbon such as $CF_4$, in general, and the natural oxide film on the surface of the silicon is removed by the fluorine radicals. At this time, in order to suppress a carbon-based residue, which is originated from the fluorocarbon, from adhering to a surface of a processing target object, an $O_2$ gas may be added into the processing gas.

If, however, the $O_2$ gas is added into the processing gas in the breakthrough process, the etching target layer may be re-oxidized by the $O_2$ gas, and an oxide-based residue originated from $SiO_2$ may be deposited on the surface of the etching target layer. As a result, in a main etching process performed after the breakthrough process, this oxide-based residue may serve as a micro mask, so that etching uniformity on the surface of the etching target layer is deteriorated. Especially, in the isotropic etching, since the etching is performed by setting a bias voltage to be low to reduce an influence from ions in the plasma, the etching uniformity may be largely affected by a surface state of the processing target object. Thus, when performing the isotropic etching on the processing target object as described in Patent Document 1, the etching uniformity may be degraded due to the oxide-based residue generated in the breakthrough process.

Further, in order to suppress a carbon-based residue and an oxide-based residue from being generated, it may be considered to use $Cl_2$ or HBr as an etchant in the breakthrough process. Since, however, these etchants have low selectivity against silicon, silicon itself may also be etched. As a result, it may be difficult to control a recess shape.

Accordingly, in the technical field, there has been a demand for an etching method capable of implementing the isotropic etching with high uniformity.

SUMMARY

In one example embodiment, a plasma etching method of etching an etching target layer containing silicon is provided. The plasma etching method includes preparing a processing target object having the etching target layer in a processing chamber; removing an oxide film on a surface of the etching target layer by generating plasma of a first processing gas that contains a fluorocarbon gas or a fluorohydrocarbon gas but does not contain oxygen; removing a carbon-based reaction product generated when the removing of the oxide film by generating plasma of a second processing gas that does not contain oxygen; and etching the etching target layer without applying a high frequency bias power to a lower electrode serving as a mounting table configured to mount the processing target object thereon by generating plasma of a third processing gas containing a fluorocarbon gas or a fluorohydrocarbon gas with a microwave.

In this plasma etching method, since the oxide film of the etching target layer is removed by the plasma of the first processing gas that contains the fluorocarbon gas or the fluorohydrocarbon gas but does not contains oxygen, it may be possible to suppress an oxide-based residue caused by the re-oxidation of the etching target layer from being generated. Further, the carbon-based reaction product is removed by the plasma of the second processing gas that does not contain oxygen, and the etching target layer is etched by the plasma of the third processing gas. Since this etching process is performed without applying a high frequency bias power to a lower electrode under the absence of the oxide-based residue and the carbon-based reaction product, it may be possible to perform the isotropic etching on the etching target layer with high uniformity. Further, since the plasma of the third processing gas is generated by using the microwave, high-density radical-dominant etching process can be performed, so that the isotropic etching can be facilitated.

The processing target object may include the etching target layer and a dummy gate formed on the etching target layer, and a part of the etching target layer located under the dummy gate may be removed in the etching of the etching target layer.

According to this plasma etching method, it may be possible to form a recess region under the dummy gate.

A microwave power ranging from about 1000 W to about 1500 W may be applied in the etching of the etching target layer.

According to this plasma etching method, by supplying a relatively low microwave power ranging from about 1000 W to about 1500 W, it may be possible to suppress an oxide-based residue from being deposited in etching the etching target layer.

An internal pressure of the processing chamber may be set to be in the range from about 100 mTorr to about 400 mTorr in the etching of the etching target layer.

According to this plasma etching method, by performing the etching process after setting the internal pressure of the processing chamber to be in the range from about 100 mTorr to about 400 mTorr, it may be possible to facilitate the etching on the etching target layer in the horizontal direction, so that the highly isotropic etching can be performed.

The third processing gas may contain Ar but does not contain $N_2$.

According to this plasma etching method, by using Ar instead of $N_2$ as the carrier gas, it may be possible to suppress an oxide-based residue from being deposited on the processing target layer when etching the processing target layer.

In accordance with the various example embodiments, it is possible to perform the isotropic etching process with high uniformity.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent from the following detailed description. The use of the same reference numbers in different figures indicates similar or identical items.

FIG. 20 is a graph illustrating shapes of recess regions of processing target objects obtained by experimental examples 14 to 16;

DETAILED DESCRIPTION

Figure 1:
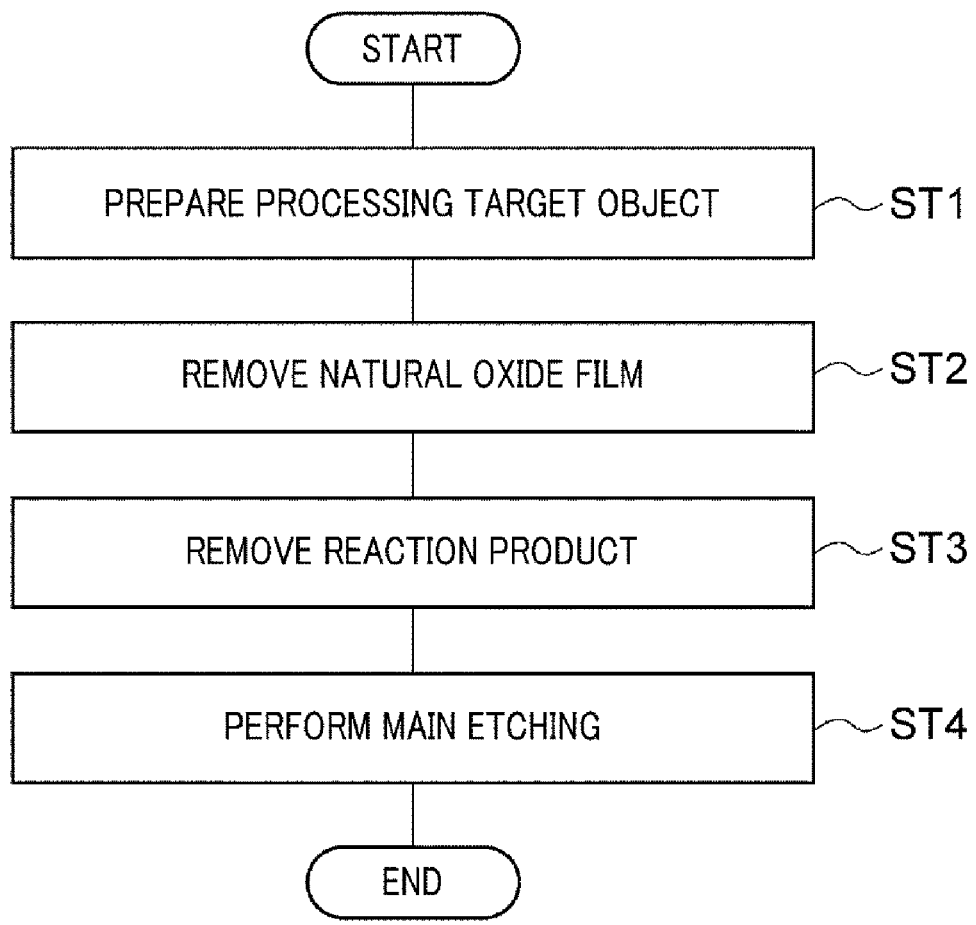
FIG. 1 is a flowchart of a plasma etching method in accordance with an example embodiment.

In the following, example embodiments will be described, and reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 2:
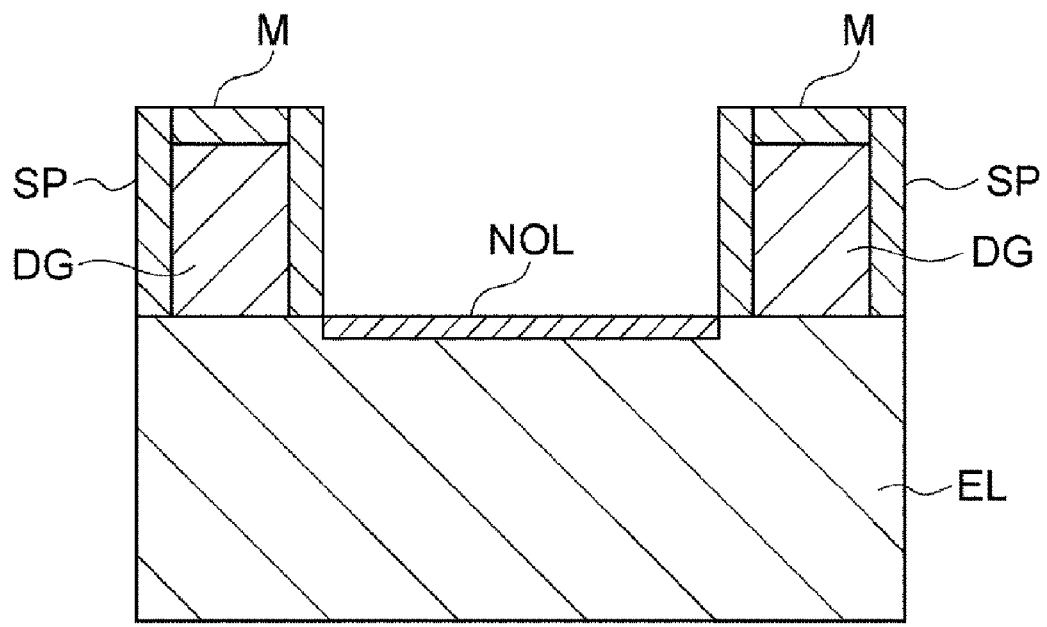
FIG. 2 is a diagram for describing a process of the plasma etching method in accordance with the example embodiment.

FIG. 1 is a flowchart for describing a plasma etching method in accordance with an example embodiment. The plasma etching method depicted in FIG. 1 is to form a recess region by removing a part of an etching target layer located under a dummy gate by etching the etching target layer. In the plasma etching method in accordance with the example embodiment, at block ST1 (prepare processing target object), a processing target object W is prepared. FIG. 2 is a cross sectional view illustrating an example of the processing target object W on which the plasma etching method of FIG. 1 is performed.

The processing target object W depicted in FIG. 2 is a product produced in the course of manufacturing a general planar type or fin type electric field effect transistor. The processing target object W has an etching target layer EL which is a crystalline silicon layer. The etching target layer EL may be formed by, for example, the chemical vapor deposition (CVD). A multiple number of dummy gates DG are provided on this etching target layer EL.

A mask M is formed on the crystalline silicon layer, and then, the crystalline silicon layer is etched to transfer a pattern of the mask M into the crystalline silicon layer, so that each dummy gate DG is formed. The mask M may be made of, but not limited to, SiN. Further, the dummy gate DG has spacers SP. The spacers SP are provided along a pair of lateral sides of the dummy gate DG. The spacers SP may be made of, but not limited to, SiN.

A natural oxide film NOL is formed between the dummy gates DG on the surface of the etching target layer EL. The natural oxide film NOL refers to an oxide film generated on a surface of the crystalline silicon layer as the etching target layer EL is exposed to the atmosphere in the manufacturing process of the processing target object W.

Referring back to FIG. 1, in the plasma etching method in accordance with the example embodiment, at the subsequent block ST2 (remove natural oxide film), the natural oxide film NOL is removed from the processing target object W. To elaborate, the natural oxide film NOL is removed by generating plasma of a first processing gas within a processing chamber and exposing the processing target object W shown in FIG. 2 to the plasma. The first processing gas may be a gas that contains a fluorocarbon gas or a fluorohydrocarbon gas but does not contain an oxygen gas. By way of non-limiting example, the first processing gas may include $CF_4$ or $CHF_3$. Further, the first processing gas may include any other gases as long as it is capable of etching the natural oxide film NOL selectively. By way of example, the first processing gas may further include an inert gas such as a $N_2$ (nitrogen) gas or an Ar (argon) gas as a carrier gas. In one example embodiment, the plasma of the first processing gas may be excited by using a microwave. Further, in the following description, the fluorocarbon gas or the fluorohydrocarbon gas may be referred to as a "fluorocarbon-based gas".

Figure 3:
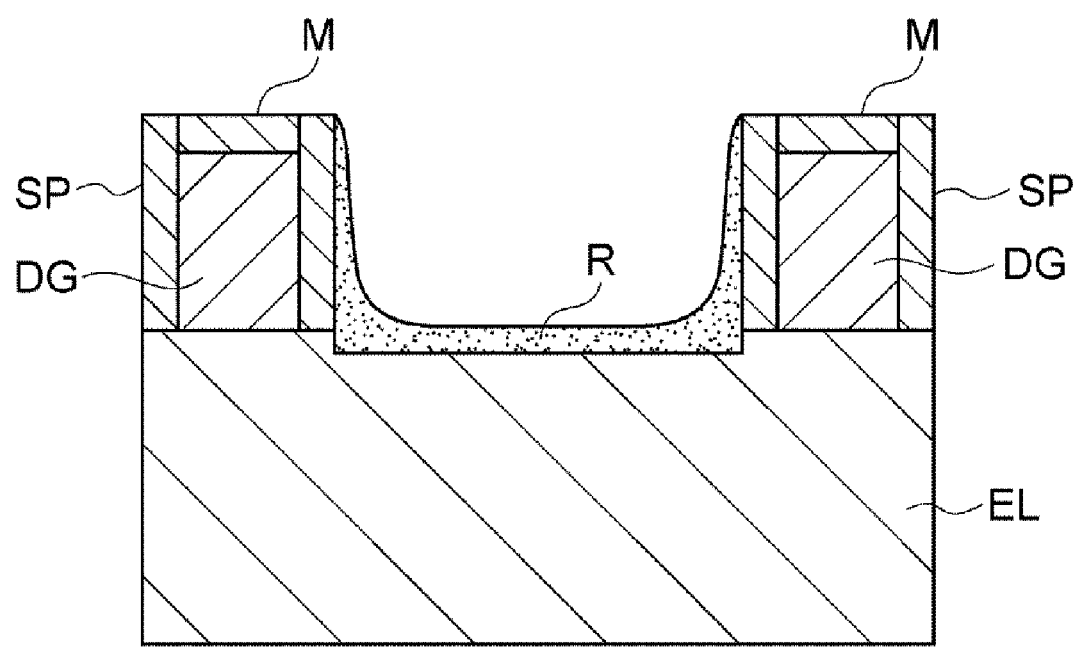
FIG. 3 is a diagram for describing a process of the plasma etching method in accordance with the example embodiment.

At this block ST2, a minimum high frequency bias power for etching the natural oxide film NOL may be applied to a lower electrode serving as a mounting table configured to mount thereon the processing target object W. Through this block ST2, the natural oxide film NOL reacts with the fluorocarbon-based gas to be removed from the surface of the etching target layer EL. Since the first processing gas does not contain oxygen, the etching target layer EL is suppressed from being re-oxidized. Meanwhile, at block ST2, $CF_x$ (X is an integer equal to or lager than 1), which is a dissociated species of the fluorocarbon-based gas, is generated as a reaction product R. As shown in FIG. 3, this reaction product R may adhere to the surface of the processing target object W. That is, this reaction product R is a carbon-based reaction product, which suppresses the etching target layer EL from being etched. In the following description, the process of removing the natural oxide film NOL at block ST2 may be referred to as a "breakthrough process."

Subsequently, at block ST3 (remove reaction product), the reaction product R is removed from the processing target object W. To elaborate, the reaction product R is removed by generating plasma of a second processing gas within the processing chamber and exposing the processing target object shown in FIG. 3 to the generated plasma. A gas, which reacts with the reaction product R to remove the reaction product R in the form of a gas and does not contain oxygen, is used as the second processing gas. Specifically, a gas containing Ar (argon) and $Cl_2$ (chlorine) may be used as the second processing gas. By using such a gas as the second processing gas, it is possible to remove the reaction product R with a high selectivity against the mask M and the spacer SP. In the example embodiment, the plasma of the second processing gas may be generated by exciting the second processing gas with a microwave.

Figure 4:
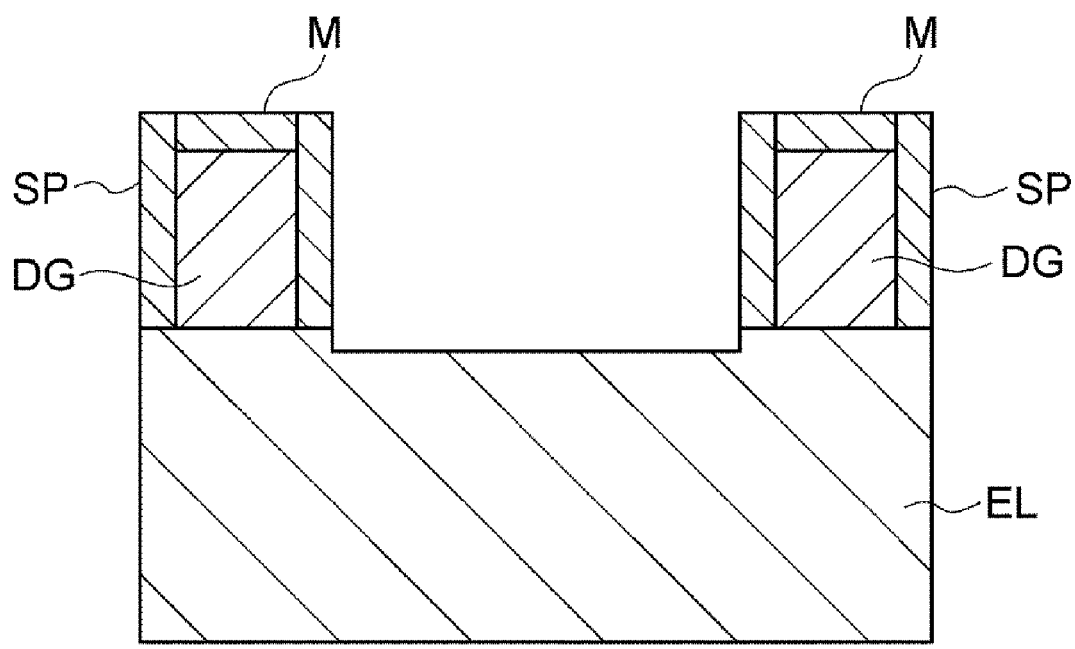
FIG. 4 is a diagram for describing a process of the plasma etching method in accordance with the example embodiment.
Figure 5:
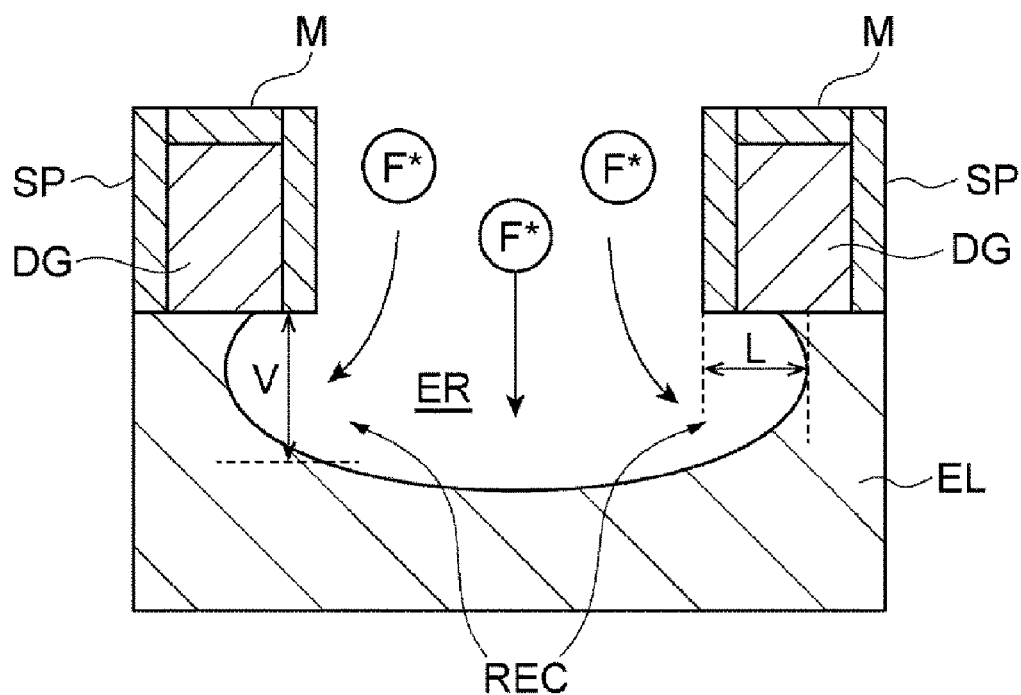
FIG. 5 is a diagram for describing a process of the plasma etching method in accordance with the example embodiment.

At block ST3, a minimum high frequency bias power for removing the reaction product R may be applied to the lower electrode serving as the mounting table configured to mount thereon the processing target object W. Through this block ST3, the reaction product R reacts with the second processing gas and is removed from the surface of the processing target object W. This reaction product R is discharged out of the processing chamber in the form of a gas. As depicted in FIG. 4, as a result of removing the reaction product R from the processing target object W at block ST3, the surface of the crystalline silicon layer of the etching target layer EL is exposed.

Subsequently, at block ST4 (perform main etching), the isotropic etching is performed on the etching target layer EL. Further, in the following description, the etching at block ST4 may be referred to as a "main etching." The etching at this block ST4 may be performed by generating plasma of a third processing gas within the processing chamber and exposing the processing target object W shown in FIG. 4 to the generated plasma. This plasma may be generated by exciting the third processing gas with a microwave. A fluorocarbon-based gas may be used as the third processing gas. By way of non-limiting example, the third processing gas may include $CF_4$ or $CHF_3$. Further, the third processing may include any other gases as long as it is capable of etching the etching target layer EL selectively. By way of non-limiting example, the third processing gas may further include an inert gas such as a $N_2$ gas or an Ar gas as a carrier gas. Further, the third processing gas may include an Ar gas as a carrier gas without containing an $N_2$ gas.

At this block ST4, the etching is performed without applying a high frequency bias power to the lower electrode. Through this process, F (fluorine) active species generated by the dissociation of the fluorocarbon-based gas are diffused to the vicinity of the surface of the etching target layer EL and react with Si (silicon). The Si, that has reacted with the F active species, is discharged out of the processing chamber in the form of a $SiF_4$ gas. In this way, since no high frequency bias power is applied at block ST4, the etching may progress both in a longitudinal direction (vertical direction) and in a transversal direction (horizontal direction) of the etching target layer EL, so that the isotropic etching is performed. In the following description, a region etched at block ST4 will be referred to as an etching region ER.

Through block ST4, parts of the etching target layer EL located under the dummy gates DG are removed, so that a recess region REC is formed. Desirably, the recess region REC may have a shape satisfying requirements for the semiconductor device. For example, the recess region REC may be formed to have a width L of about 12 nm, and a LV ratio, which is a ratio of the width L to a depth V of the recession region, may be set to be larger than a value of 1.

The shape of the recess region REC may be controlled by adjusting an internal pressure of the processing chamber at block ST4. In the main etching process of block ST4, if the internal pressure of the processing chamber is set to be equal to or higher than, e.g., about 100 mTorr, the etching tends to progress in the horizontal direction. Further, if the internal pressure of the processing chamber is set to be in the range from, e.g., about 100 mTorr to about 400 mTorr, the LV ratio tends to be improved. For this reason, in the example embodiment, the internal pressure of the processing chamber in the main etching process may be set to be in the range from, e.g., about 100 mTorr to about 400 mTorr.

In the present example embodiment, the processes of blocks ST2 to ST4 may be performed in a single plasma processing apparatus. Further, at block ST4, the plasma of the third processing gas may be generated by supplying a microwave power ranging from, e.g., about 1000 W to about 1500 W from a microwave generator to be described. By dissociating the processing gas at such a relatively low power, it is possible to suppress the oxide-based residues from being deposited on the etching target layer EL.

Figure 6:
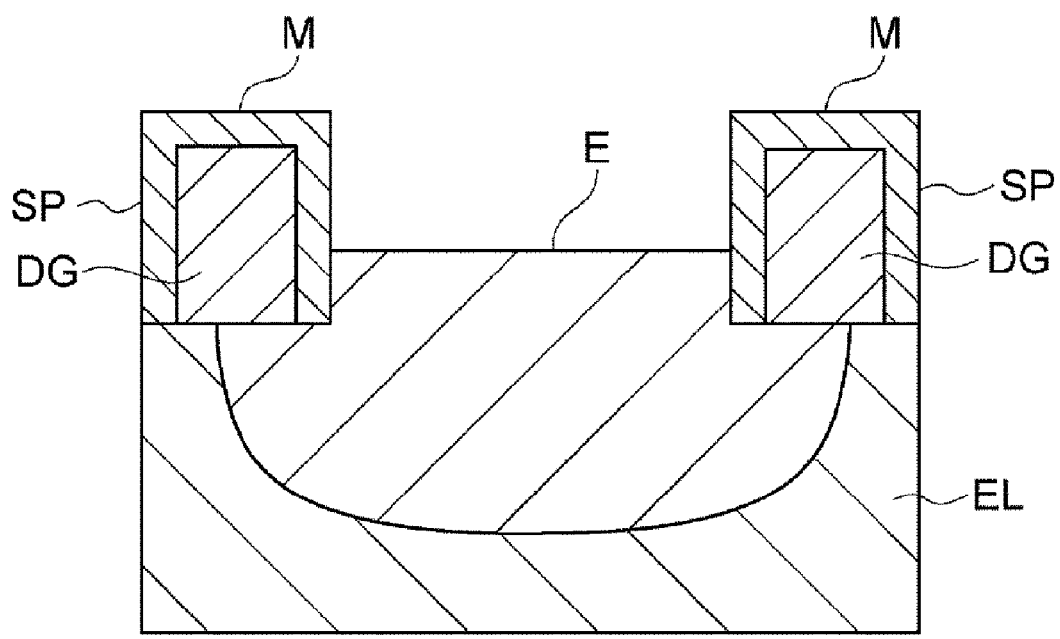
FIG. 6 is a diagram for describing a process of the plasma etching method in accordance with the example embodiment.

In the present example embodiment, a semiconductor layer E may be formed on the processing target object W. The semiconductor layer E may be formed by epitaxially growing SiGe or SiC on the etching target layer EL through, but not limited to, the chemical vapor deposition (CVD). As illustrated in FIG. 6, the semiconductor layer E is filled into the etching region ER formed in the main etching process to be extended from a bottom of the etching region ER to a portion of the dummy gate DG in a height direction. Through this process, the semiconductor layer E is buried in the recess region REC.

Figure 7:
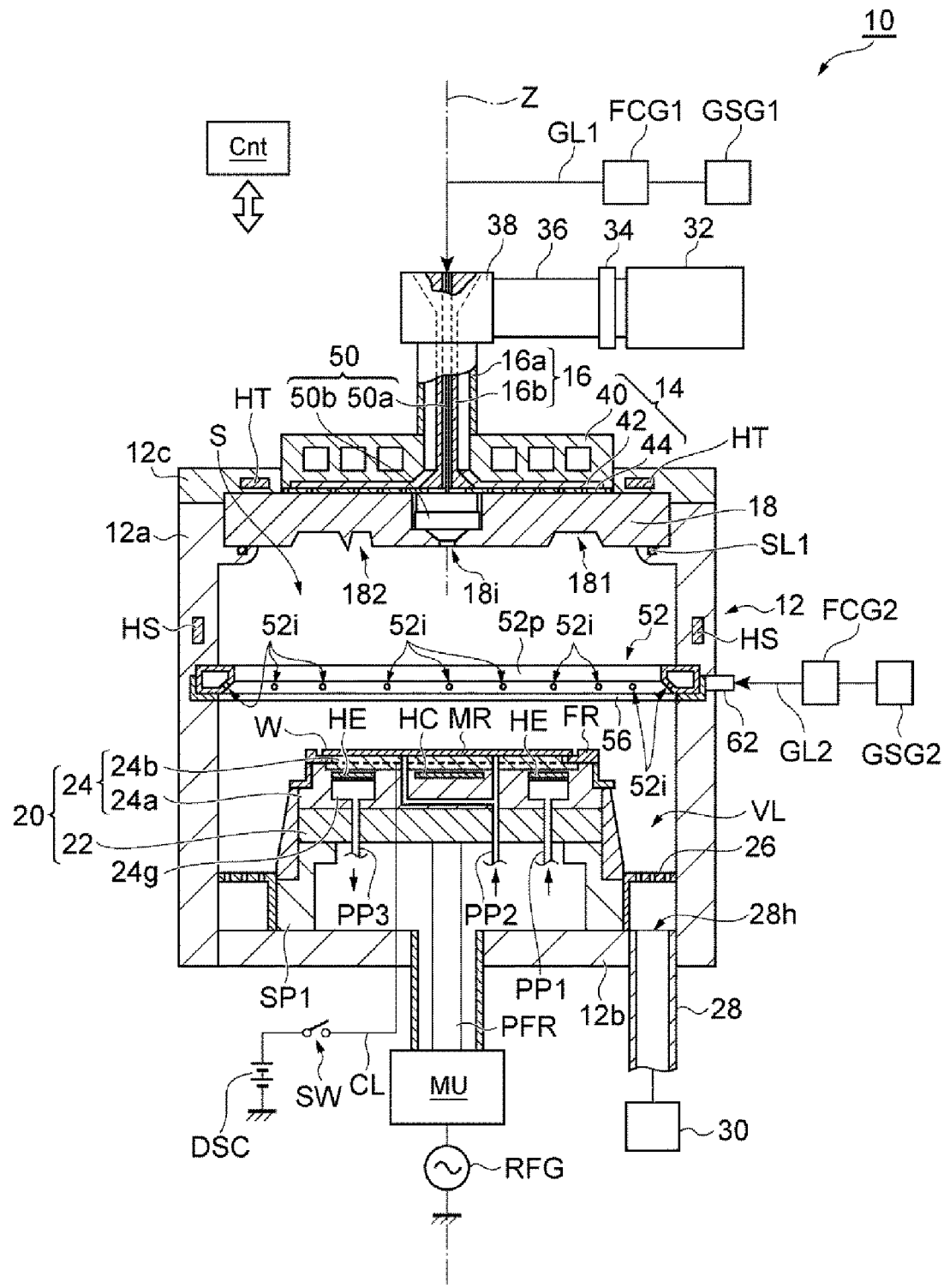
FIG. 7 is a cross sectional view schematically illustrating a plasma processing apparatus in accordance with the example embodiment.

Now, a plasma processing apparatus using a microwave as a plasma source will be described as an example plasma processing apparatus in which the plasma etching method in accordance with the example embodiment is performed. FIG. 7 is a cross sectional view schematically illustrating a plasma processing apparatus in accordance with an example embodiment.

As shown in FIG. 7, the plasma processing apparatus 10 includes a processing chamber 12. In the processing chamber 12, a processing space S for accommodating a processing target object W therein is formed. The processing chamber 12 includes a sidewall 12a, a bottom portion 12b and a ceiling portion 12c.

The sidewall 12a has a substantially cylindrical shape extending in an extension direction of an axial line Z (hereinafter, referred to as "axis line Z direction"). The bottom portion 12b is provided at a lower end of the sidewall 12a. An upper end of the sidewall 12a is opened. The opening of the upper end of the sidewall 12a is closed by a dielectric window 18. The dielectric window 18 is supported between the upper end of the sidewall 12a and the ceiling portion 12c. A sealing member SL1 may be provided between the dielectric window 18 and the upper end of the sidewall 12a. The sealing member SL1 may be, but not limited to, an O-ring and configured to seal the processing chamber 12.

The plasma processing apparatus 10 may further includes a mounting table 20. The mounting table 20 is provided within the processing chamber 12 and under the dielectric window 18. The mounting table 20 includes a plate 22 and an electrostatic chuck 24.

The plate 22 is a metallic member having a substantial disc shape and made of, for example, aluminum. The plate 22 is supported by a cylindrical supporting member SP1. The supporting member SP1 extends vertically upward from the bottom portion 12b. The plate 22 also serves as a high frequency electrode. The plate 22 is electrically connected to a high frequency power supply RFG, which generates a high frequency bias power, via a matching unit MU and a power supply rod RFR. The high frequency power supply RFG supplies the high frequency bias power having a certain frequency, e.g., about 13.65 MHz, suitable for controlling energy of ions attracted to the processing target object W. The matching unit MU includes a matching device configured to match an impedance at the side of the high frequency power supply RFG with a load impedance such as mainly the electrode, plasma and the processing chamber 12. A blocking capacitor for generating self-bias is included within the matching device.

The electrostatic chuck 24 is provided on an upper surface of the plate 22. The electrostatic chuck 24 includes a base plate 24a and a chuck portion 24b. The base plate 24a is a metallic member having a substantial disc shape and made of, for example, aluminum. The base plate 24a is provided on the plate 22, and the chuck portion 24b is provided on an upper surface of the base plate 24a. An upper surface of the chuck portion 24b serves as a mounting region MR on which the processing target object W is mounted. The chuck portion 24b is configured to hold the processing target object W by an electrostatic adsorptive force. The chuck portion 24b includes an electrode film interposed between dielectric films. A DC power supply DSC is electrically connected to the electrode film of the chuck portion 24b via a switch SWT and a coated line CL. The chuck portion 24b is capable of attracting and holding the processing target object W on the upper surface thereof with a Coulomb force generated by a DC voltage applied from the DC power supply DSC. A focus ring FR annularly surrounding an edge portion of the processing target object W is provided diametrically outside the chuck portion 24b.

An annular coolant path 24g extending in a circumferential direction of the base plate 24a is formed within the base plate 24a. A coolant of a preset temperature, e.g., cooling water is supplied from a chiller unit through pipes PP1 and PP3 to be circulated through the coolant path 24g. A processing temperature of the processing target object W held on the chuck portion 24b can be controlled by adjusting the temperature of the coolant. Further, a heat transfer gas, e.g., a He gas is supplied a space between the upper surface of the chuck portion 24b and a rear surface of the processing target object W from a heat transfer gas supply unit through a gas supply pipe PP2.

An annular gas exhaust path VL is formed around the mounting table 20. An annular baffle plate 26 having a multiple number of through holes is provided at a portion of the gas exhaust path VL in the axis line Z direction. The gas exhaust path VL is connected to a gas exhaust line 28 having a gas exhaust opening 28h. The gas exhaust line 28 is provided at the bottom portion 12b of the processing chamber 12 and is connected to a gas exhaust device 30. The gas exhaust device 30 may include a pressure controller and a vacuum pump such as a turbo molecular pump. The processing space S within the processing chamber 12 can be depressurized to a certain vacuum level by the gas exhaust device 30. Further, by operating the gas exhaust device 30, it is possible to exhaust a gas from the outer periphery of the mounting table 20 through the gas exhaust path VL.

Further, the plasma processing apparatus 10 may further include heaters HT, HS and HE as temperature control devices. The heater HT is provided within the ceiling portion 12c and annularly extends to surround an antenna 14. The heater HS is provided within the sidewall 12a and also annularly extends. The heater HC is provided within the base plate 24a to be located under a central portion of the aforementioned mounting region MR, i.e., located at a region through which the axial line Z is passed, within the base plate 24a. Further, the heater HE is provided within the base plate 24a and annularly extends to surround the heater HC. The heater HE is provided under an outer periphery portion of the aforementioned mounting region MR.

The plasma processing apparatus 10 may further include the antenna 14, a coaxial waveguide 16, the dielectric window 18, a microwave generator 32, a tuner 34, a waveguide 36 and a mode converter 38. The microwave generator 32 is configured to generate a microwave having a frequency of, e.g., about 2.45 GHz. The microwave generator 32 is connected to an upper portion of the coaxial waveguide 16 via the tuner 34, the waveguide 36 and the mode converter 38. A central axis line of the coaxial waveguide 16 is the axis line Z, and the coaxial waveguide 16 extends along the axis line Z. In the present example embodiment, a center of the mounting region MR of the mounting table 20 is positioned on the axis line Z.

The coaxial waveguide 16 includes an outer conductor 16a and an inner conductor 16b. The outer conductor 16a has a cylindrical shape extending along the axis line Z. A lower end of the outer conductor 16a may be electrically connected to an upper portion of a cooling jacket 40 having a conductive surface. The inner conductor 16b is provided inside the outer conductor 16a to be coaxially arranged with the outer conductor 16a. The inner conductor 16b has a cylindrical shape extending along the axis line Z. A lower end of the inner conductor 16b is connected to a slot plate 44 of the antenna 14.

In the example embodiment, the antenna 14 is configured as a radial line slot antenna. The antenna 14 is placed within the opening formed in the ceiling portion 12c and is positioned on the upper surface of the dielectric window 18. The antenna 14 includes a dielectric plate 42 and the slot plate 44. The dielectric plate 42 is configured to shorten a wavelength of a microwave and has a substantial disc shape. The dielectric plate 42 may be made of, but not limited to, quartz or alumina. The dielectric plate 42 is held between the slot plate 44 and a lower surface of the cooling jacket 40. Accordingly, the antenna 14 may include the dielectric plate 42, the slot plate 44 and the lower surface of the cooling jacket 40.

Figure 8:
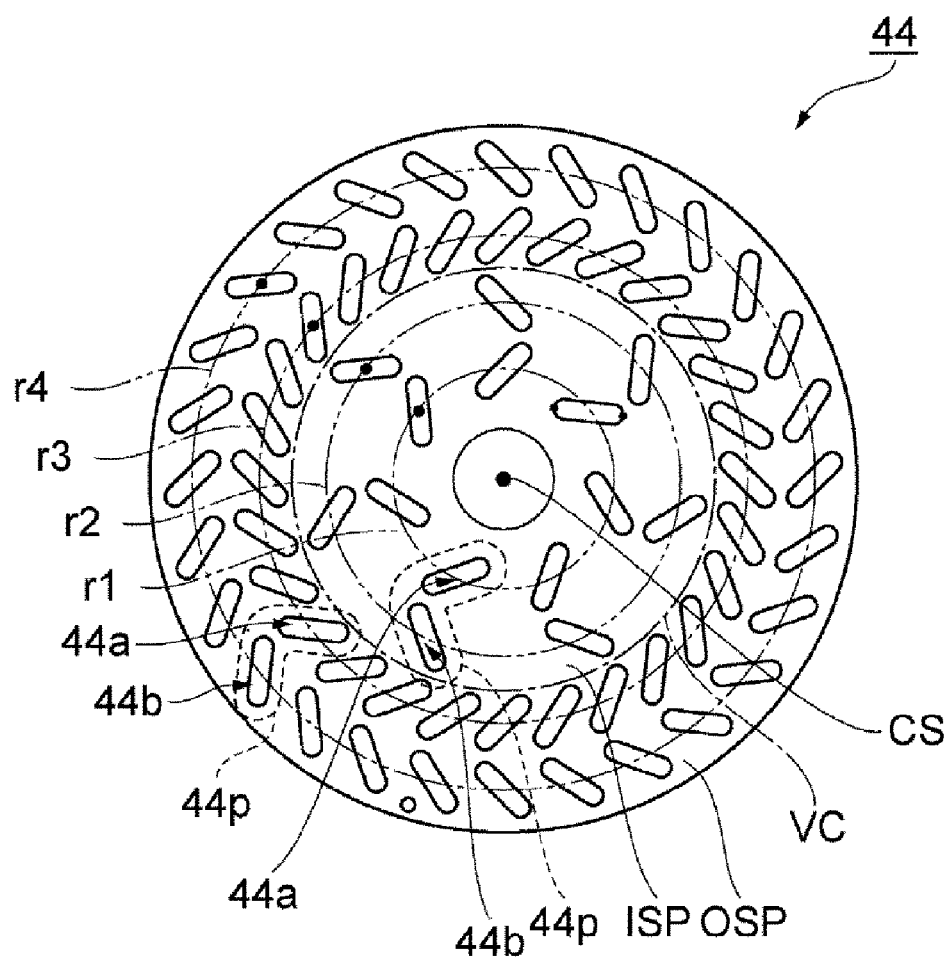
FIG. 8 is a plane view illustrating an example slot plate.

FIG. 8 is a plane view illustrating an example of the slot plate. The slot plate 44 has a thin plate and disc shape. Both surfaces of the slot plate 44 in a plate thickness direction thereof are flat. A center CS of the circular slot plate 44 is positioned on the axial line Z. The slot plate 44 has a multiple number of slot pairs 44p. Each slot pair 44p includes two slot holes 44a and 44b penetrating through the slot plate 44. When viewed from the plane, each of the slot holes 44a and 44b has an elongated shape. In each slot pair 44p, a direction in which a major axis of the slot hole 44a extends and a direction in which a major axis of the slot hole 44b extends are intersected with each other or orthogonal to each other.

In an example shown in FIG. 8, the multiple number of slot pairs 44p are divided into an inner slot pair group ISP arranged inside an imaginary circle VC about the axis line Z and an outer slot pair group OPS arranged outside the imaginary circle VC. The inner slot pair group ISP includes multiple slot pairs 44p. In the example shown in FIG. 8, the inner slot pair group ISP includes seven slot pairs 44p. The multiple slot pairs 44p of the inner slot pair group ISP are equally spaced in a circumferential direction with respect to the center CS. Further, multiple slot holes 44a belonging to the inner slot pair group ISP are equally spaced such that centers of the slot holes 44a are located on a circle having a radius r1 from the center CS of the slot plate 44. Further, a multiple slot holes 44b belonging to the inner slot pair group ISP are equally spaced such that centers of the slot holes 44b are located on a circle having a radius r2 from the center CS of the slot plate 44. Here, the radius r2 is larger than the radius r1.

The outer slot pair group OPS also includes a multiple number of slot pairs 44p. In the example shown in FIG. 8, the outer slot pair group OSP includes twenty eight slot pairs 44p. The slot pairs 44p of the outer slot pair group OSP are equally spaced in the circumferential direction with respect to the center CS. Multiple slot holes 44a belonging to the outer slot pair group OSP are equally spaced such that centers of the slot holes 44a are located on a circle having a radius r3 from the center CS of the slot plate 44. Further, multiple slot holes 44b belonging to the outer slot pair group OSP are equally spaced such that centers of the slot holes 44b are located on a circle having a radius r4 from the center CS of the slot plate 44. Here, the radius r3 is larger than the radius r2, and the radius r4 is larger than the radius r3.

The slot holes 44a of the inner slot pair group ISP and the outer slot pair group OSP are arranged such that long sides thereof have the same angle with respect to a line segment connecting the center CS and a center of the slot hole 44a. Further, the slot holes 44b of the inner slot pair group ISP and the outer slot pair group OSP are arranged such that long sides thereof have the same angle with respect to a line segment connecting the center CS and a center of the slot hole 44b.

Figure 9:
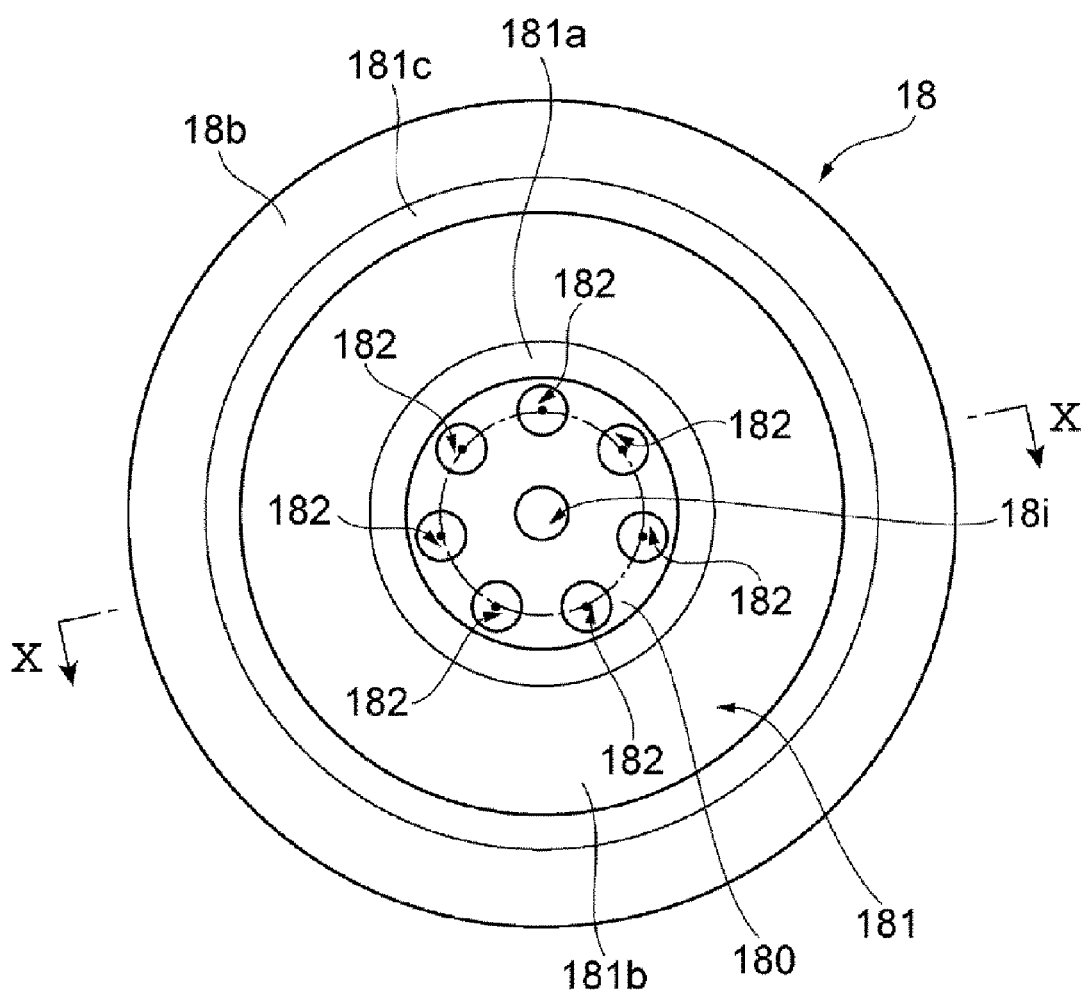
FIG. 9 is a plane view illustrating an example dielectric window.
Figure 10:
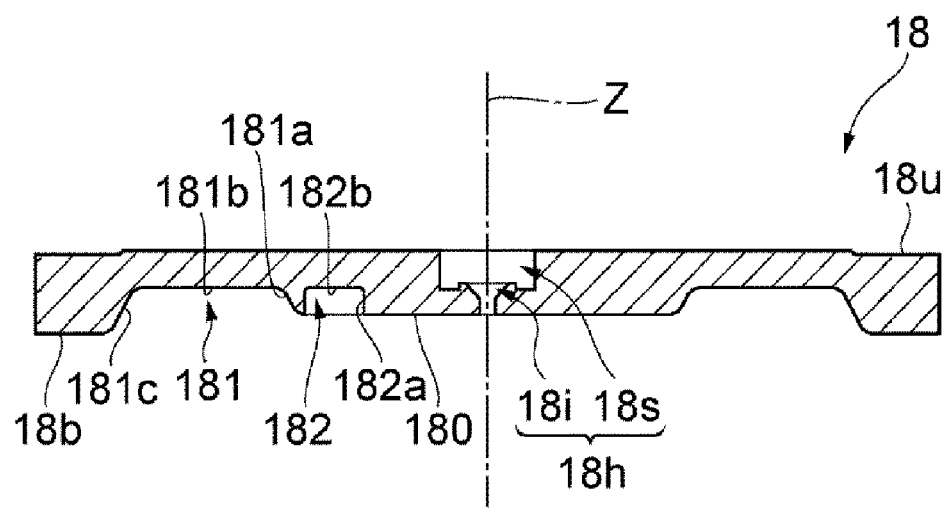
FIG. 10 is a cross sectional view taken along a line X-X of FIG. 9.

FIG. 9 is a plane view illustrating an example of the dielectric window, and illustrates a status of the dielectric window when viewed from the processing space S. FIG. 10 is a cross sectional view taken along a line X-X of FIG. 9. The dielectric window 18 has a substantially disc shape and may be made of a dielectric material such as, but not limited to, quartz or alumina. The slot plate 44 is provided on an upper surface 18u of the dielectric window 18.

A through hole 18h is formed at a central portion of the dielectric window 18. An upper portion of the through hole 18h serves as a space 18s for accommodating therein an injector 50b of a central inlet unit 50 to be described later, and a lower portion of the through hole 18h serves as a central inlet opening 18i of the central inlet unit 50 to be described later. Further, a central axis line of the dielectric window 18 coincides with the axis line Z.

A surface of the dielectric window opposite to the upper surface 18u, i.e., a lower surface 18b of the dielectric window is in contact with the processing space S, and plasma is generated at the side of the lower surface 18b. Various shapes are formed in the lower surface 18b. To elaborate, the lower surface 18b has a planar surface 180 at a central portion surrounding the central inlet opening 18i. The planar surface 180 is a flat surface orthogonal to the axis line Z. In the lower surface 18b, a first recess portion 181 is annularly and continuously formed such that sidewalls thereof taper upwardly in the plate thickness direction of the dielectric window 18.

The first recess 181 has an inner tapered surface 181a, a bottom surface 181b and an outer tapered surface 181c. The bottom surface 181b is located closer to the upper surface 18u rather than the planar surface 180 is, and is annularly extended in parallel with the planar surface 180. The inner tapered surface 181a is annularly extended between the planar surface 180 and the bottom surface 181b, and is inclined with respect to the planar surface 180. The outer tapered surface 181c is annularly extended between the bottom surface 181b and a periphery portion of the lower surface 18b and is inclined with respect to the bottom surface 181b. Further, a periphery portion of the lower surface 18b is in contact with the sidewall 12a.

The lower surface 18b further has multiple second recesses 182 are formed to be upwardly recessed in the plate thickness direction from the planar surface 180. The number of the multiple second recesses 182 may be seven in the example shown in FIG. 9 and FIG. 10. These second recesses 182 are equally spaced along the circumferential direction thereof. Further, each of the second recesses 182 has a circular shape on a surface orthogonal to the axis line Z when viewed from the plane. To elaborate, an inner side surface 182a of the second recess 182 is a cylindrical surface extending in the axis line Z direction. Further, a bottom surface 182b of the second recess 182 is located closer to the upper surface 18u rather than the planar surface 180, and is a circular surface parallel with the planar surface 180.

Figure 11:
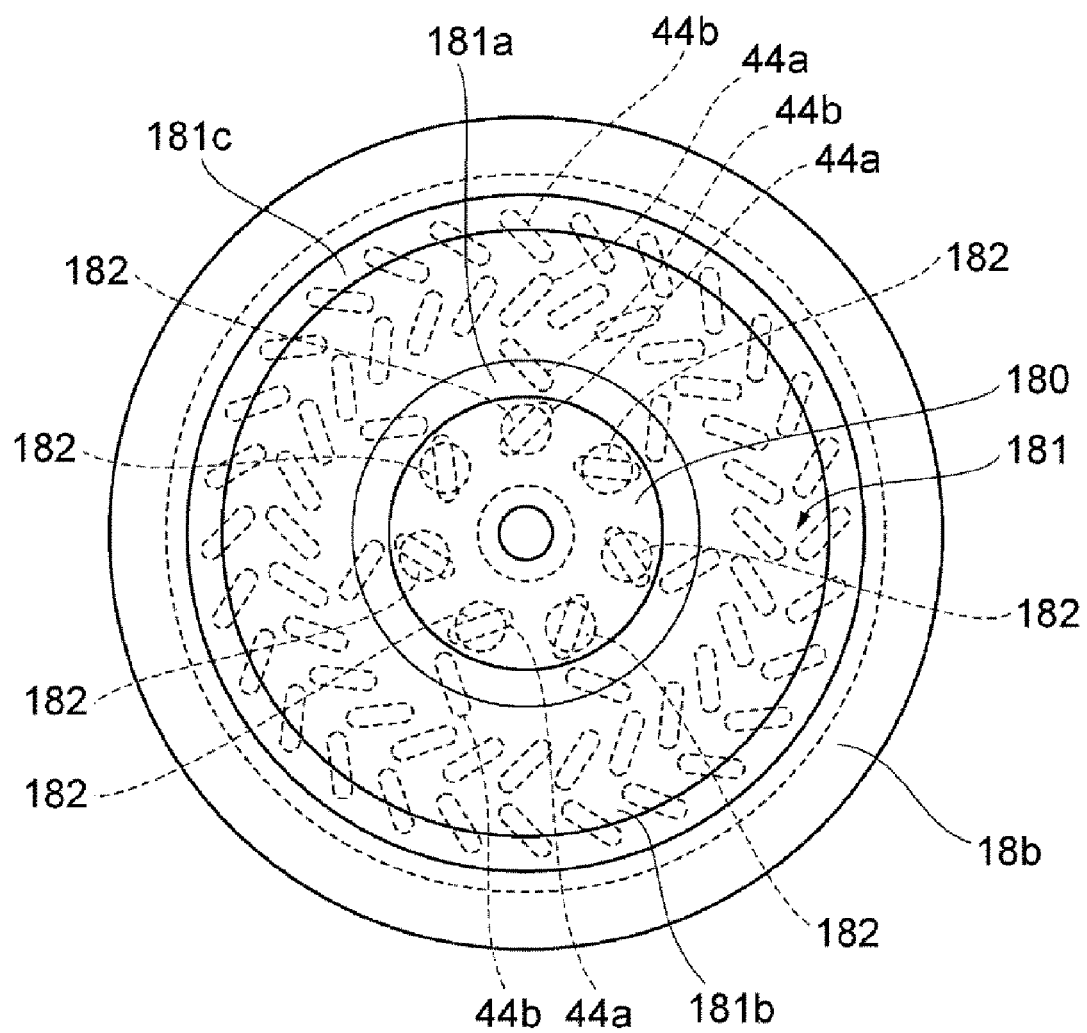
FIG. 11 is a plane view illustrating a configuration in which the slot plate shown in FIG. 8 is provided on the dielectric window shown in FIG. 9.

FIG. 11 is a plane view illustrating a state where the slot plate shown in FIG. 8 is provided on the dielectric window shown in FIG. 9, and illustrates a status of the dielectric window 18 when viewed from the bottom. As depicted in FIG. 11, when viewed from the plane, i.e., when viewed from the axis line Z direction, the slots holes 44a of the outer slot pair group OSP and the slot holes 44b of the inner slot pair group ISP are overlapped with the first recess 181. Specifically, when viewed from the plane, a portion of each slot hole 44b of the outer slot pair group OSP is overlapped with the outer tapered surface 181c, and the other portion thereof is overlapped with the bottom surface 181b. Further, when viewed from the plane, the slot holes 44a of the outer slot pair group OSP are overlapped with the bottom surface 181b. Further, when viewed from the plane, a portion of each slot hole 44b of the inner slot pair group ISP is overlapped with the inner tapered surface 181b, and the other portion thereof is overlapped with the bottom surface 181b.

Further, when viewed from the plane, i.e., when viewed from the axis line Z direction, each of the multiple slot holes 44a of the inner slot pair group ISP is overlapped with each of the second recess 182. To elaborate, when viewed from the plane, the center of the bottom surface of each second recess 182 is located within each slot holes 44a of the inner slot pair group ISP.

Referring back to FIG. 7, in the plasma processing apparatus 10, a microwave generated by the microwave generator 32 is propagated toward the dielectric plate 42 through the coaxial waveguide 16, and is supplied to the dielectric window 18 from the slot holes 44a and 44b of the slot plate 44.

In the dielectric window 18, as stated above, a portion in which the first recess portion 181 is formed and a portion in which the second recess 182 is formed are set to be thinner than the other portions. Accordingly, in the dielectric window 18, microwave transmittance becomes higher at these portions in which the first recess 181 and the second recesses 182 are formed. Further, when viewed from the axis line Z direction, the slot holes 44a and 44b of the outer slot pair group OSP and the slot holes 44b of the inner slot pair group ISP are overlapped with the first recess 181, and each of the slot holes 44a of the inner slot pair group ISP is overlapped with each of the second recesses 182. Accordingly, an electric field of the microwave may be concentrated on the first recess 181 and the second recesses 182, so that microwave energy is concentrated on the first recess 181 and the second recesses 182. As a result, it is possible to stably generate plasma at the first recess 181 and the second recesses 182, and also possible to allow plasma right under the dielectric window 18 to be stably distributed in the diametrical direction and the circumferential direction.

Further, the plasma processing apparatus 10 includes the central inlet unit 50 and a peripheral inlet unit 52. The central inlet unit 50 includes a pipe 50a, the injector 50b and the central inlet opening 18i. The pipe 50a passes through an inner hole of the inner conductor 16b. An end of the pipe 50a is extended to the inside of the space 18s (see FIG. 10) of the dielectric window 18 along the axis line Z. The injector 50b is provided within this space 18s and is located under the end of the pipe 50a. The injector 50b includes a multiple number of through holes extending in the axis line Z direction. Further, in the dielectric window 18, the central inlet opening 18i is formed. The central inlet opening 18i is continuously formed under the space 18s and extends along the axis line Z. The central inlet unit 50 described above is configured to supply a gas to the injector 50b through the pipe 50a and discharge the gas from the injector 50b through the central inlet opening 18i. As such, the central inlet unit 50 discharges the gas toward right under the dielectric window 18 along the axis line Z. That is, the central inlet unit 50 introduces the gas toward a plasma generation region having a high electron temperature.

The peripheral inlet unit 52 includes multiple peripheral inlet openings 52i. The multiple peripheral inlet openings 52i mainly supply a gas toward an edge portion of the processing target object W. The multiple peripheral inlet openings 52i are oriented to the edge portion of the processing target object W or a peripheral portion of the mounting region MR. The peripheral inlet openings 52i are arranged along the circumferential direction between the central inlet opening 18i and the mounting table 20. That is, the multiple peripheral inlet openings 52i are annularly arranged around the axis line Z at a region (plasma diffusion region) having a lower electron temperature than the region right under the dielectric window. The peripheral inlet unit 52 supplies the gas toward the processing target object W from the region having the lower electron temperature. Accordingly, it is possible to allow a dissociation degree of the gas introduced into the processing space S from the peripheral inlet unit 52 to be lower than a dissociation degree of the gas introduced into the processing space S from the central inlet unit 50.

Figure 12:
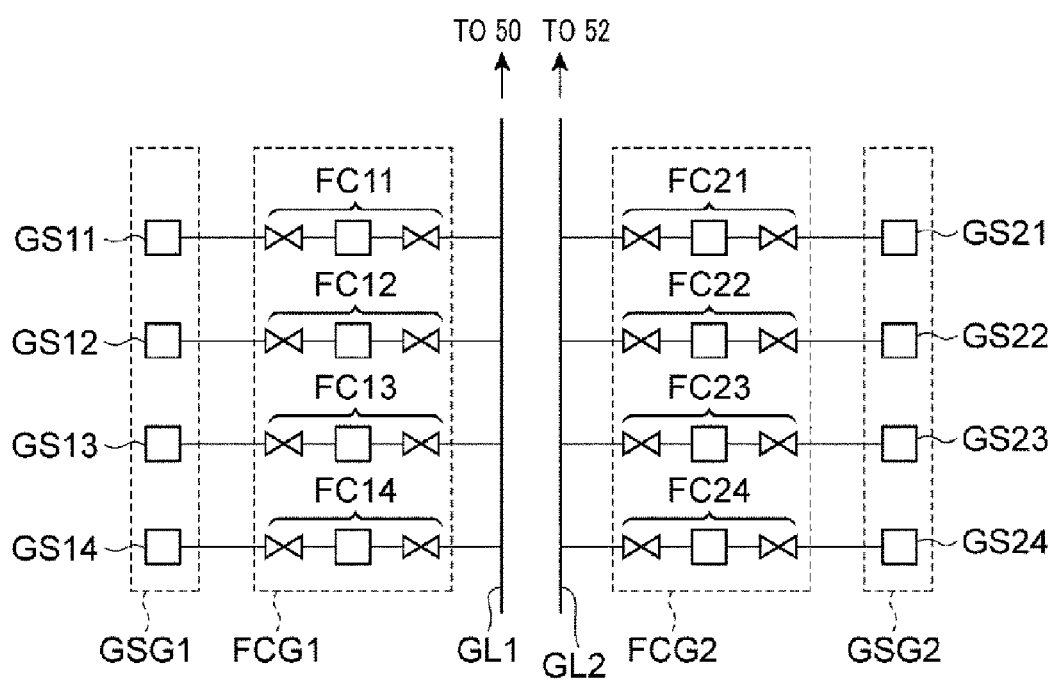
FIG. 12 is a diagram illustrating a gas supply system including a first flow rate control unit group, a first gas source group, a second flow rate control unit group and a second gas source group.

A first gas source group GSG1 is connected to the central inlet unit 50 via a first flow rate control unit group FCG1, and a second gas source group GSG2 is connected to the peripheral inlet unit 52 via a second flow rate control unit group FCG2. FIG. 12 is a diagram illustrating a gas supply system including the first flow rate control unit group, the first gas source group, the second flow rate control unit group and the second gas source group. As depicted in FIG. 12, the first gas source group GSG1 includes multiple first gas sources GS11 to GS14. The first gas sources GS11 to GS14 are a $CF_4$ gas source, a $Cl_2$ gas source, an Ar gas source and an $N_2$ gas source, respectively. The first gas source group GSG1 may further include a gas source different from these gas sources.

The first flow rate control unit group FCG1 includes multiple first flow rate control units FC11 to FC14. Each of the first flow rate control units ECU to FC14 includes, for example, two valves and a flow rate controller provided between the two valves. The flow rate controller may be, but not limited to, a mass flow controller. The first gas sources GS11 to GS14 are connected to a common gas line GL1 via the first flow rate control units ECU to FC14, respectively. The common gas line GL1 is connected to the central inlet unit 50.

The second gas source group GSG2 includes a multiplicity of second gas sources GS21 to GS24. The second gas sources GS21 to GS24 are a $CF_4$ gas source, a $Cl_2$ gas source, an Ar gas source and an $N_2$ gas source, respectively. The second gas source group GSG2 may further include a gas source different from these gas sources.

The second flow rate control unit group FCG2 includes a multiplicity of second flow rate control units FC21 to FC24. Each of the second flow rate control units FC21 to FC24 includes, for example, two valves and a flow rate controller provided between the two valves. The flow rate controller may be, but not limited to, a mass flow controller. The second gas sources GS21 to GS24 are connected to a common gas line GL2 via the second flow rate control units FC21 to FC24, respectively. The common gas line GL2 is connected to the peripheral inlet unit 52.

As stated above, in the plasma processing apparatus 10, the first gas sources and the first flow rate control units are provided only for the central inlet unit 50, and the second gas sources and the second flow rate control units, which are independent of the first gas sources and the first flow rate control units, are provided only for the peripheral inlet unit 52. Accordingly, it is possible to independently control a kind of a gas to be introduced into the processing space S from the central inlet unit 50 and a flow rate of one or more gases to be introduced into the processing space S from the central inlet unit 50. Further, it is also possible to independently control a kind of a gas to be introduced into the processing space S from the peripheral inlet unit 52 and a flow rate of one or more gases to be introduced into the processing space S from the peripheral inlet unit 52.

By way of example, in the plasma processing apparatus 10, a flow rate ratio of a reactive gas to a rare gas in the gases introduced into the processing space S from the peripheral inlet unit 52 may be set to be higher than a flow rate ratio of a reactive gas to a rare gas in the gases introduced into the processing space S from the central inlet unit 50. Here, the reactive gas may be the $CF_4$ gas and the $Cl_2$ gas. Further, a flow rate of the reactive gas introduced into the processing space S from the peripheral inlet unit 52 may be set to be higher than a flow rate of the reactive gas introduced into the processing space S from the central inlet unit 50. Further, by way of example, it may be possible to introduce a rare gas into the processing space S from the central inlet unit 50 and introduce a reactive gas into the processing space S from the peripheral inlet unit 52. To elaborate, at block ST4 of a plasma etching method in accordance with the example embodiment, a $CF_4$ gas may be introduced into the processing space S from the peripheral inlet unit 52, and an Ar gas may be introduced into the processing space S from the central inlet unit 50. Accordingly, in the plasma processing apparatus 10, it may be possible to supply a greater amount of active species of the reactive gas to the edge portion of the processing target object W without being deactivated. Furthermore, in the plasma processing apparatus 10, it may be also possible to suppress the reactive gas from being excessively dissociated. Especially, a dissociation that might cause generation of fluorine active species can be suppressed.

In the present example embodiment, the plasma processing apparatus 10 may further include a control unit Cnt, as depicted n FIG. 7. The control unit Cnt may be a controller such as a programmable computer device. The control unit Cnt is configured to control respective components of the plasma processing apparatus 10 according to programs based on recipes. By way of example, the control unit Cnt may transmit control signals to the first flow rate control units FC11 to FC14 to control a kind of a gas and a flow rate of the gas to be supplied into the central inlet unit 50. Further, the control unit Cnt may also transmit control signals to the second flow rate control units FC21 to FC24 to control a kind of a gas and a flow rate of the gas to be supplied into the peripheral inlet unit 52. Furthermore, the control unit Cnt may supply control signals to the microwave generator 32, the high frequency power supply RFG and the gas exhaust device 30 to control the microwave power, power and ON/OFF of RF bias, and a pressure within the processing chamber 12. Moreover, the control unit Cnt may transmit control signals to heater power supplies connected to the heaters HT, HS, HC and HE to control temperatures of these heaters.

In the present example embodiment, the peripheral inlet unit 52 may further include an annular pipe 52p. This annular pipe 52p includes a multiple number of peripheral inlet openings 52i. The annular pipe 52p may be made of, but not limited to, quartz. As shown in FIG. 7, in the present example embodiment, the annular pipe 52p is provided along an inner surface of the sidewall 12a. That is, the annular pipe 52p is not provided on a path connecting a lower surface of the dielectric window 18 and the mounting region MR, i.e., the processing target object W. Thus, the annular pipe 52p does not suppress diffusion of plasma. Further, since the annular pipe 52p is provided along the inner surface of the sidewall 12a, damage of the annular pipe 52p caused by the plasma can be suppressed, so that a frequency of exchanging the annular pipe 52p can be reduced. In addition, since the annular pipe 52p is provided along the sidewall 12a of which temperature can be controlled by a heater, it may be possible to improve stability of a temperature of a gas to be introduced into the processing space S from the peripheral inlet unit 52.

Moreover, in the present example embodiment, the peripheral inlet openings 52 are oriented toward the edge portion of the processing target object W. That is, the peripheral inlet openings 52i are inclined with respect to the flat surface orthogonal to the axis line Z to discharge a gas toward the edge portion of the processing target object W. In this configuration, since the peripheral inlet openings 52i are inclined and oriented to the edge portion of the processing target object W, active species of the reactive gas discharged from the peripheral inlet openings 52i directly head toward the edge portion of the processing target object W. Accordingly, it is possible to supply the active species of the reactive gas can be supplied to the edge portion of the processing target object W without being deactivated. As a result, it may be possible to reduce nonuniformity in a processing rate on each portion at of the processing target object W in a radial direction.

In the plasma etching method in accordance with the above-described example embodiment, the natural oxide film NOL of the etching target layer EL is removed by plasma of the first processing gas that contains the fluorocarbon gas or fluorohydrocarbon gas but does not contain oxygen. Thus, it is possible to suppress an oxide-based residue caused by the re-oxidation of the etching target layer EL from being generated. Further, the carbon-based reaction product R is removed by plasma of the second processing gas that does not contain oxygen, and the etching target layer EL is etched by plasma of the third processing gas. Since this etching process is performed without applying a high frequency bias power to the mounting table 20 under the absence of an oxide-based residue and a carbon-based reaction product R, it is possible to perform the isotropic etching on the etching target layer EL with high uniformity. Further, since the plasma of the third processing gas is generated by using a microwave, high-density radical-dominant etching process can be performed, so that the isotropic etching can be more facilitated.

Now, various experimental examples conducted by using the plasma processing apparatus 10 to evaluate the plasma etching method in accordance with the example embodiment will be discussed.

Experimental Example 1 and Comparative Examples 1 and 2

In an experimental example 1, the process of block ST2 of the plasma etching method described in FIG. 1 is performed by using the plasma processing apparatus 10, and an effect thereof is evaluated. To elaborate, in the experimental example 1, by supplying an Ar gas and a $CF_4$ gas as a first processing gas into the processing chamber 12 from the central inlet unit 50 and the peripheral inlet unit 52 of the plasma processing apparatus 10 at flow rates of, e.g., about 600 sccm and about 12 sccm, respectively, a processing target object W is plasma-etched, so that a natural oxide film on the processing target object W is removed. Then, a surface of the processing target object W obtained by the experimental example 1 is analyzed by X-ray photoelectron spectroscopy (XPS). Further, in comparative examples 1 and 2, the same processing target objects W as used in the experimental example 1 are plasma-etched by adding an $O_2$ gas into the first processing gas at flow rates of, e.g., about 5 sccm and about 9 sccm, respectively. Then, the processing target object W obtained by the experimental example 1, the processing target objects W obtained by the comparative examples 1 and 2, and a processing target object W of an initial state prepared at block ST1 are compared. In the experimental example 1 and the comparative examples 1 and 2, the other processing conditions are as follows.

Figure 13A:
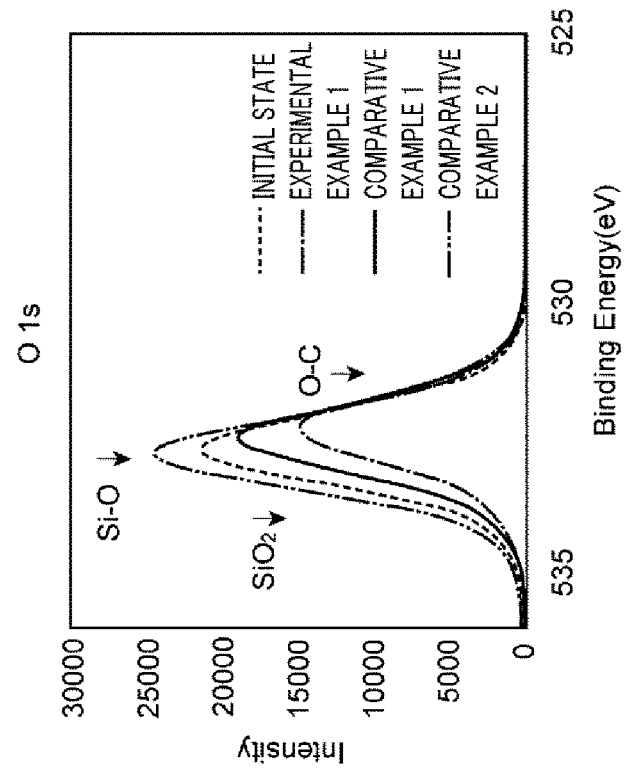
FIG. 13A and FIG. 13B are graphs showing XPS measurement results of processing target objects obtained by an experimental example 1 and comparative examples 1 and 2.
Figure 13B:
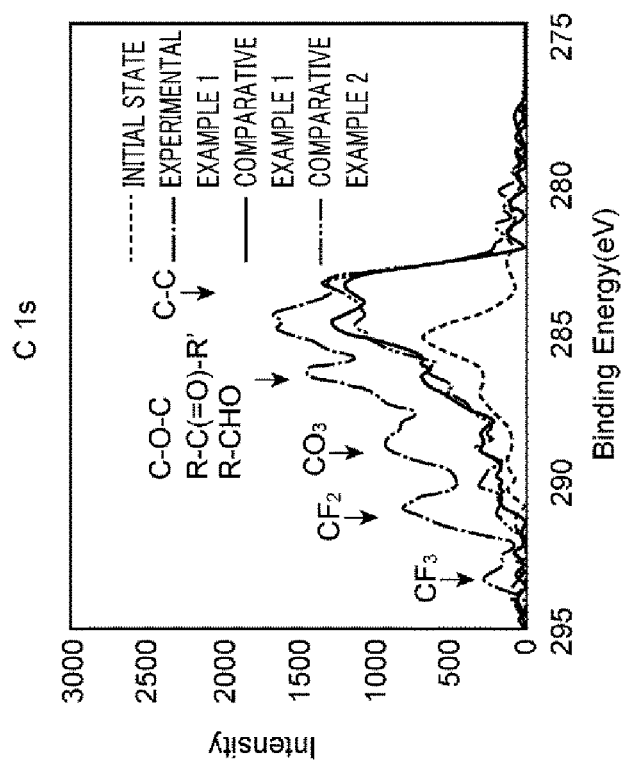

(Processing Conditions at Block ST2 in Experimental Example 1 and Comparative Examples 1 and 2)
Internal pressure of the processing chamber 12: about 20 mT (about 2.666 Pa)
Microwave: about 2.45 MHz, about 1000 W
High frequency bias power: about 13.65 MHz, about 50 W
Processing time: about 20 sec XPS measurement results of the processing target objects W obtained by the experimental example 1 and the comparative examples 1 and 2 are shown in FIG. 13A and FIG. 13B. FIG. 13A shows an XPS spectrum of a 1s orbital of carbon (C) at the surface of each processing target object W, and FIG. 13B shows an XPS spectrum of a 1s orbital of oxygen (O) at the surface of each processing target object W. As can be seen from FIG. 13A, it is found out that a greater amount of carbide exists on the processing target object W obtained by the experimental example 1, as compared to the cases of the processing target object W of the initial state and the processing target objects W obtained by the comparative examples 1 and 2. This may be because, in the experimental example 1 where $O_2$ is not added into the processing gas, a large amount of carbon-based reaction product is generated in the breakthrough process at block ST2 and adheres to the surface of the processing target object W. Meanwhile, as shown in FIG. 13B, an amount of oxide is found to be smaller on the processing target object W obtained by the experimental example 1, as compared to the cases of the processing target object W of the initial state and the processing target objects W obtained by the comparative examples 1 and 2. From this result, it is proved that, in the experimental example 1, a natural oxide film can be appropriately removed from the surface of the processing target object W and an oxide is difficult to be generated on the surface of the processing target object W.

Experimental Example 2 and Comparative Example 3

In an experimental example 2, by using the plasma processing apparatus 10, the process of block ST3 is performed after a breakthrough process of block ST2 of the plasma etching method in accordance with the example embodiment, and an effect thereof is evaluated. To elaborate, in the experimental example 2, by supplying an Ar gas and a $CF_4$ gas as a second processing gas into the processing chamber 12 from the central inlet unit 50 and the peripheral inlet unit 52 of the plasma processing apparatus 10, a processing target object W is plasma-etched so that a carbon-based reaction product adhering to the surface of the processing target object W is removed. Thereafter, the surface of the processing target object W obtained by performing a main etching process of block ST4 is analyzed by X-ray photoelectron spectroscopy (XPS). Further, in a comparative example 3, a main etching process of block ST4 is performed without performing the process of block ST3 after the breakthrough process. Then, the processing target object W obtained by the experimental example 2, a processing target object W obtained by the comparative example 3 and a processing target object W of an initial state are compared. In the experimental example 2 and the comparative example 3, the other processing conditions are as follows.

Figure 14A:
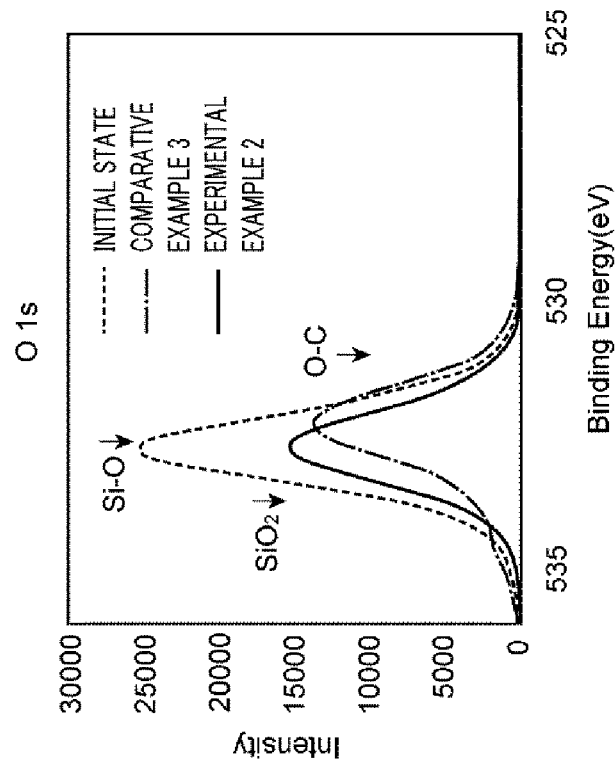
FIG. 14A and FIG. 14B are graphs showing XPS measurement results of processing target objects obtained by an experimental example 2 and a comparative example 3.
Figure 14B:
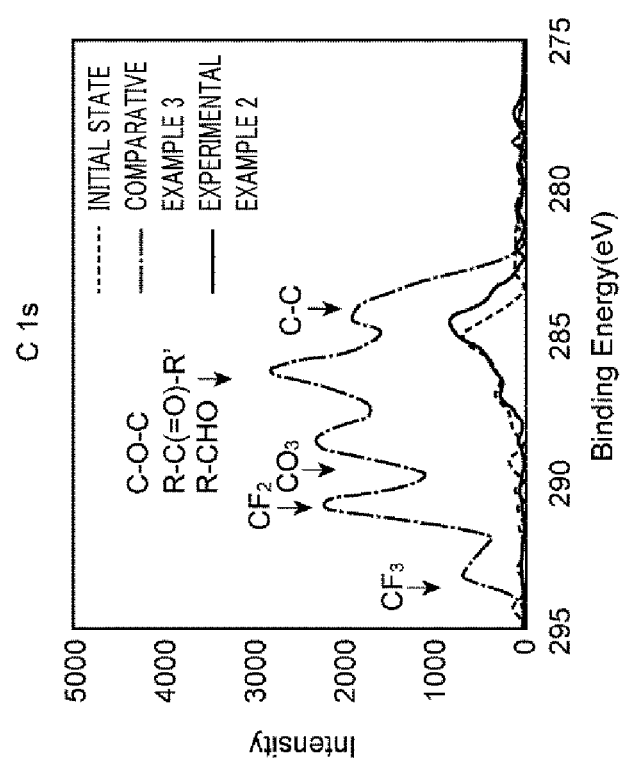
Figure 15:
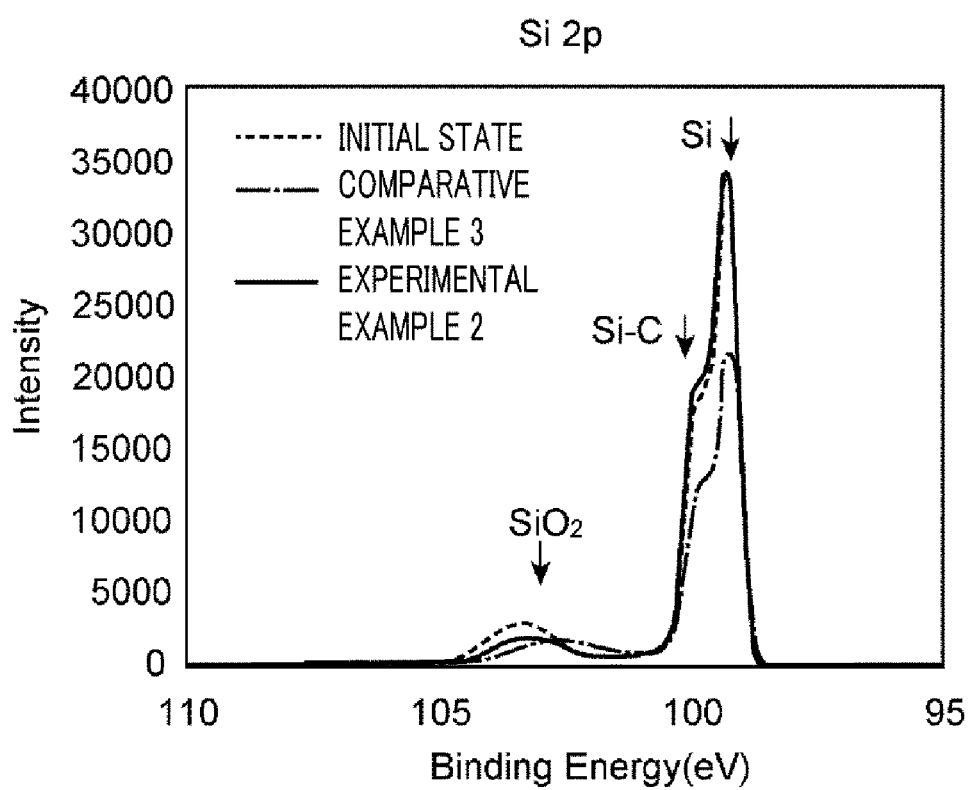
FIG. 15 is a graph showing XPS measurement results of processing target objects obtained by the experimental example 2 and the comparative example 3.

(Processing Conditions at Block ST2 in Experimental Example 2 and Comparative Example 3)
Internal pressure of the processing chamber 12: about 20 mT (about 2.666 Pa)
Microwave: about 2.45 MHz, about 2000 W
High frequency bias power: about 13.65 MHz, about 75 W
Flow rate of Ar gas: about 600 sccm
Flow rate of $CF_4$ gas: about 12 sccm
Processing time: about 20 sec
(Processing Conditions at Block ST3 in Experimental Example 2)
Internal pressure of the processing chamber 12: about 20 mT (about 2.666 Pa)
Microwave: about 2.45 MHz, about 2000 W
High frequency bias power: about 13.65 MHz, about 75 W
Flow rate of Ar gas: about 600 sccm
Flow rate of $Cl_2$ gas: about 32 sccm
Processing time: about 10 sec
(Processing Conditions at Block ST4 in Experimental Example 2 and Comparative Example 3)
Internal pressure of the processing chamber 12: about 200 mT (about 26.66 Pa)
Microwave: about 2.45 MHz, about 3000 W
High frequency bias power: about 13.65 MHz, 0 W
Flow rate of $N_2$ gas: about 500 sccm
Flow rate of $Cl_2$ gas: about 120 sccm
Flow rate of $CF_4$ gas: about 12 sccm
Processing time: about 20 sec XPS measurement results of the processing target objects W obtained by the experimental example 2 and the comparative example 3 are shown in FIG. 14A to FIG. 15. FIG. 14A shows an XPS spectrum of a 1s orbital of carbon (C) at the surface of each processing target object; FIG. 14B shows an XPS spectrum of a 1s orbital of oxygen (O) at the surface of each processing target object W; and FIG. 15 shows an XPS spectrum of a 2p orbital of silicon (Si). As can be seen from FIG. 14A, an amount of a carbide on the processing target object W obtained by the experimental example 2 is found to be much smaller than that in case of the processing target object W obtained by the comparative example 3, and the substantially same amount of carbide as that in case of the processing target object W of the initial state is observed. From this result, it is proved that most of carbon-based reaction products generated at block ST2 can be removed through block ST3. Further, as shown in FIG. 14B, an amount of an oxide on the processing target object W obtained by the experimental example 2 is found to be much smaller than that in case of the processing target object W of the initial state, and the substantially same amount of oxide as that in case of the processing target object W obtained by the comparative example 3 is observed. From this result, it is proved that the processing target object W is not oxidized anymore at block ST3. Further, as shown in FIG. 15, an amount of $SiO_2$ on the processing target object W obtained by the experimental example 2 is found to be smaller than that of the processing target object W of the initial state, while an amount of Si is maintained. From this result, it is proved that a natural oxide film NOL is selectively removed from the processing target object W in the plasma etching method in accordance with the example embodiment.

Experimental Examples 3 to 6

In experimental examples 3 to 6, the process of block ST4 of the plasma etching method in accordance with the example embodiment is performed while varying a microwave power supplied into the processing chamber 12 as a parameter. Then, surfaces of processing target objects W obtained by the experimental examples 3 to 6 are analyzed by X-ray photoelectron spectroscopy (XPS). Further, processing conditions at block ST2 and block ST3 as pre-treatment are set to be same in the experimental examples 3 to 6, and the other processing conditions at block ST4 are as follows.

(Processing Conditions at Block ST4 in Experimental Example 3)

Internal pressure of the processing chamber 12: about 200 mT (about 26.66 Pa)
Microwave: about 2.45 MHz, about 3000 W
High frequency bias power: about 13.65 MHz, 0 W
Flow rate of $N_2$ gas: about 500 sccm
Flow rate of $Cl_2$ gas: about 120 sccm
Flow rate of $CF_4$ gas: about 12 sccm
Processing time: about 20 sec (Processing Conditions at Block ST4 in Experimental Example 4)

Internal pressure of the processing chamber 12: about 200 mT (about 26.66 Pa)
Microwave: about 2.45 MHz, about 2000 W
High frequency bias power: about 13.65 MHz, 0 W
Flow rate of $N_2$ gas: about 200 sccm
Flow rate of $Cl_2$ gas: about 120 sccm
Flow rate of $CF_4$ gas: about 12 sccm
Processing time: about 30 sec (Processing Conditions at Block ST4 in Experimental Example 5)

Internal pressure of the processing chamber 12: about 200 mT (about 26.66 Pa)
Microwave: about 2.45 MHz, about 1500 W
High frequency bias power: about 13.65 MHz, 0 W
Flow rate of $N_2$ gas: about 200 sccm
Flow rate of $Cl_2$ gas: about 120 sccm
Flow rate of $CF_4$ gas: about 12 sccm
Processing time: about 40 sec (Processing Conditions at Block ST4 in Experimental Example 6)

Figure 16:
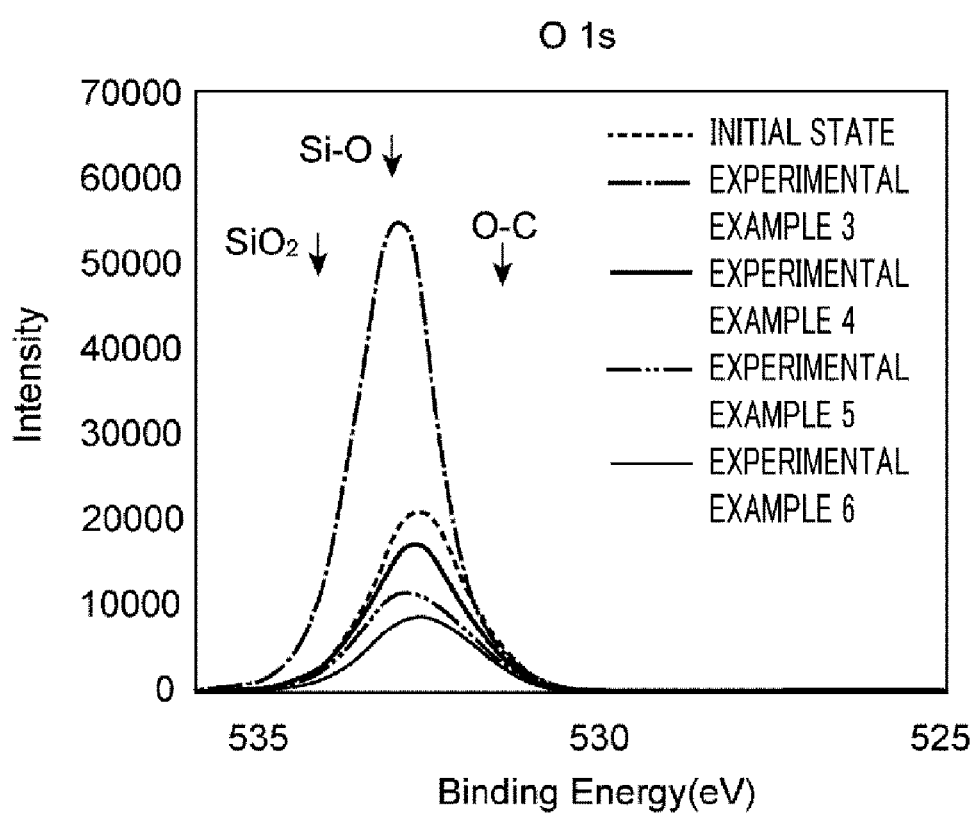
FIG. 16 is a graph showing XPS measurement results of processing target objects obtained by experimental examples 3 to 6.

Internal pressure of the processing chamber 12: about 200 mT (about 26.66 Pa)
Microwave: about 2.45 MHz, about 1000 W
High frequency bias power: about 13.65 MHz, 0 W
Flow rate of $N_2$ gas: about 200 sccm
Flow rate of $Cl_2$ gas: about 120 sccm
Flow rate of $CF_4$ gas: about 12 sccm
Processing time: about 60 sec XPS measurement results of the processing target objects W obtained by the experimental examples 3 to 6 are shown in FIG. 16. FIG. 16 provides a XPS spectrum of a 1s orbital of oxygen (O) at the surface of each processing target objects W. As can be seen from FIG. 16, it is proved that an oxide existing on the surface of each processing target object W decreases as the microwave power is decreased. This oxide is found to be an oxide-based residue originated from $SiO_2$ which is generated during the main etching process of block ST4.

Figure 17:
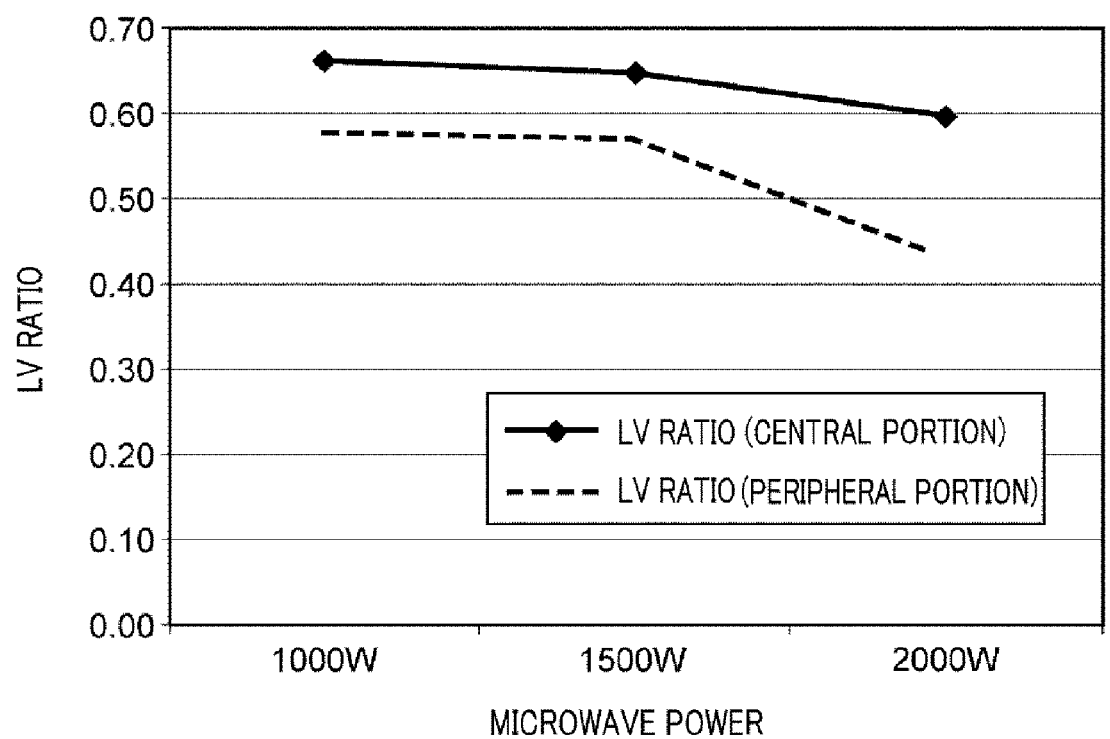
FIG. 17 is a graph showing LV ratios at central portions and peripheral portions of processing target objects obtained by experimental examples 4 to 6.

Further, FIG. 17 is a graph showing LV ratios at a central portion and a peripheral portion of each of the processing target objects W obtained by the experimental examples 4 to 6. As shown in FIG. 17, it is observed that the LV ratio is improved at both of the central portion and the peripheral portion of each processing target object W as the microwave power supplied from the microwave generator 32 is decreased. As proved from the results provided in FIG. 16 and FIG. 17, by setting the microwave power supplied from the microwave generator 32 to be in the range from, e.g., about 1000 W to about 1500 W, it is possible to suppress an oxide-based residue from being generated on the processing target objects W and to improve the LV ratios. Meanwhile, if the microwave power is set to be larger than about 1500 W, a device performance may be degraded by being affected due to the oxide-based residue, and if the microwave power is set to be smaller than about 1000 W, it may be difficult to generate plasma.

Experimental Examples 7 to 9

In experimental examples 7 to 9, an amount of an oxide-based residue generated on a processing target object W is investigated while varying a flow rate of an $N_2$ gas added into a processing gas at block ST4 of the plasma etching method in accordance with the example embodiment. To elaborate, in the experimental examples 7 to 9, flow rates of the $N_2$ gas added into the processing gas are set to be about 500 sccm, about 100 sccm and about 0 sccm, respectively. Then, surfaces of processing target objects W obtained by the experimental examples 7 to 9 are analyzed by X-ray photoelectron microscopy (XPS). Further, in the experimental examples 7 to 9, processing conditions at block ST2 and block ST3 as pre-treatment are set to be same, and other processing conditions are as specified below.

(Processing Conditions at Block ST4 in Experimental Examples 7 to 9)

Figure 18:
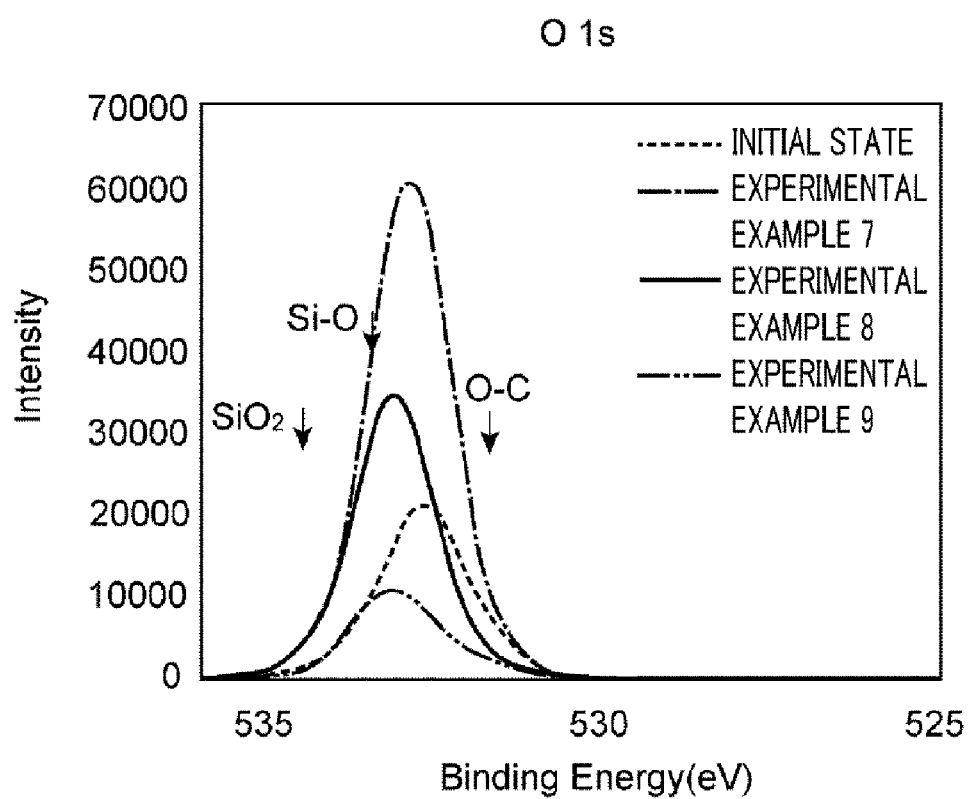
FIG. 18 is a graph showing XPS measurement results of processing target objects obtained by experimental examples 7 to 9.

Internal pressure of the processing chamber 12: about 200 mT (about 26.66 Pa)
Microwave: about 2.45 MHz, about 3000 W
High frequency bias power: about 13.65 MHz, 0 W
Flow rate of $Cl_2$ gas: about 120 sccm
Flow rate of $CF_4$ gas: about 12 sccm
Processing time: about 20 sec XPS measurement results of the processing target objects W obtained by the experimental examples 7 to 9 are provided in FIG. 18. FIG. 18 illustrates a XPS spectrum of a 1s orbital of oxygen (O) at the surface of each processing target object W. As can be seen from FIG. 18, it is proved that the amount of the oxide-based residue generated on the processing target object W at block ST4 decreases as the flow rate of the $N_2$ gas added into the processing gas at block ST4 decreases.

Experimental Examples 10 to 13

In experimental examples 10 to 13, an amount of an oxide-based residue generated on a processing target object W is investigated while varying a kind of a carrier gas and a flow rate of the carrier gas added into a processing gas at block ST4 of the plasma etching method in accordance with the example embodiment. To elaborate, in the experimental example 10, an $N_2$ gas is added into the processing gas at block ST4 at a flow rate of about 500 sccm. In the experimental examples 11 and 12, instead of the $N_2$ gas, an Ar gas is added into the processing gas at block ST4 at a flow rate of about 440 sccm. In the experimental example 13, instead of the $N_2$ gas, an Ar gas is added into the processing gas at block ST4 at a flow rate of about 200 sccm. Further, a microwave power of about 3000 W is applied from the microwave generator 32 in the experimental examples 10 and 11, and a microwave power of about 2000 W is applied from the microwave generator 32 in the experimental examples 12 and 13. Surfaces of the processing target objects W obtained by the experimental examples 10 to 13 are analyzed by X-ray photoelectron microscopy (XPS). Further, in the experimental examples 10 to 13, processing conditions at block ST2 and block ST3 as pre-treatment are set to be same, and the other processing conditions at block ST4 are as follows.

(Processing Conditions at Block ST4 in Experimental Examples 10 to 13)
Internal pressure of the processing chamber 12: about 200 mT (about 26.66 Pa)
Microwave: about 2.45 MHz, about 3000 W
High frequency bias power: about 13.65 MHz, 0 W
Flow rate of $Cl_2$ gas: about 120 sccm
Flow rate of $CF_4$ gas: about 12 sccm
Processing time: about 20 sec (experimental examples 10 and 11), about 30 sec (experimental examples 12 and 13)

Figure 19:
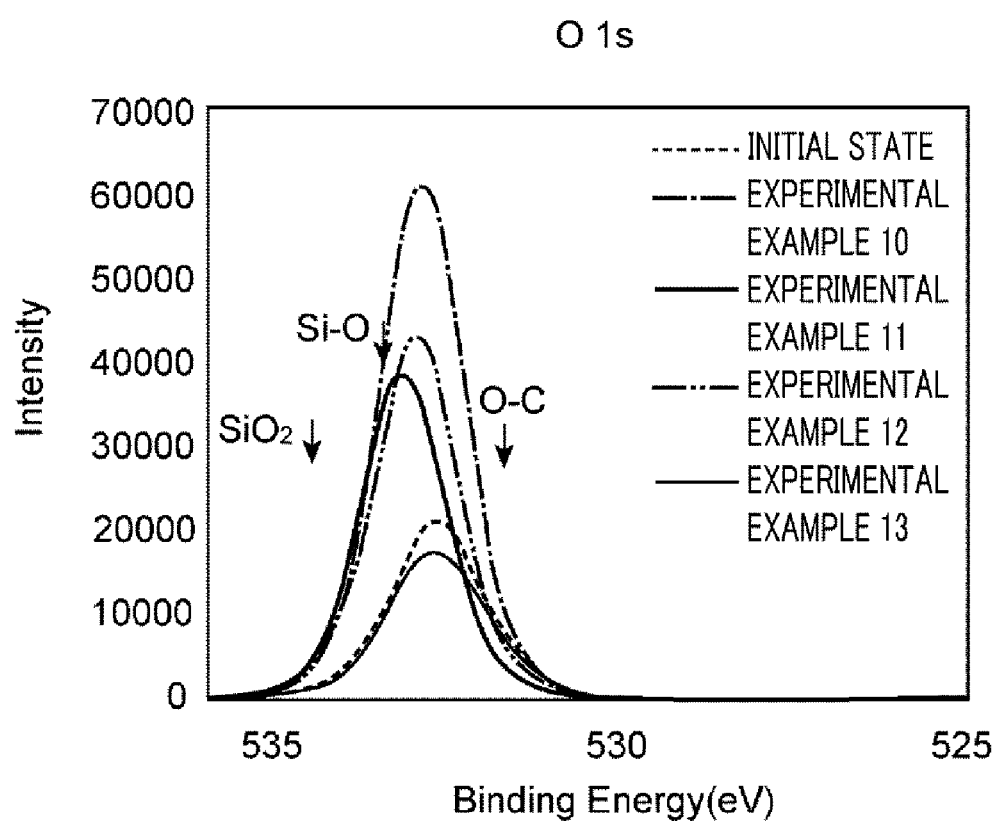
FIG. 19 is a graph showing XPS measurement results of processing target objects obtained by experimental examples 10 to 13.

XPS measurement results of the processing target objects W obtained by the experimental examples 10 to 13 are provided in FIG. 19. FIG. 19 illustrates a XPS spectrum of a 1s orbital of oxygen (O) at the surface of each processing target object W. As can be seen from FIG. 19, it is proved that the amount of the oxide-based residue generated on the processing target object W at block ST4 is decreased by adding the Ar gas as the carrier gas without adding the $N_2$ gas thereto. Further, it is also found out that the amount of the oxide-based residue generated on the processing target object W at block ST4 also depends on the flow rate of the Ar gas added into the processing gas, and the amount of the oxide-based residue decreases as the flow rate of the Ar gas is decreased.

Experimental Examples 14 to 16

In experimental examples 14 to 16, a shape of a formed recess region REC is investigated while varying an internal pressure of the processing chamber 12 as a parameter at block ST4 of the plasma etching method in accordance with the example embodiment. To elaborate, in the experimental examples 14 to 16, a main etching process of block ST4 is performed by setting the internal pressure of the processing chamber 12 to be about 20 mT (about 2.66 Pa), about 100 mT (about 13.33 Pa), and about 200 mT (about 26.66 Pa), respectively. Further, in the experimental examples 14 to 16, processing conditions at block ST2 and block ST3 as pre-treatment are set to be same, and the other processing conditions at block ST4 are as follows.

Figure 21:
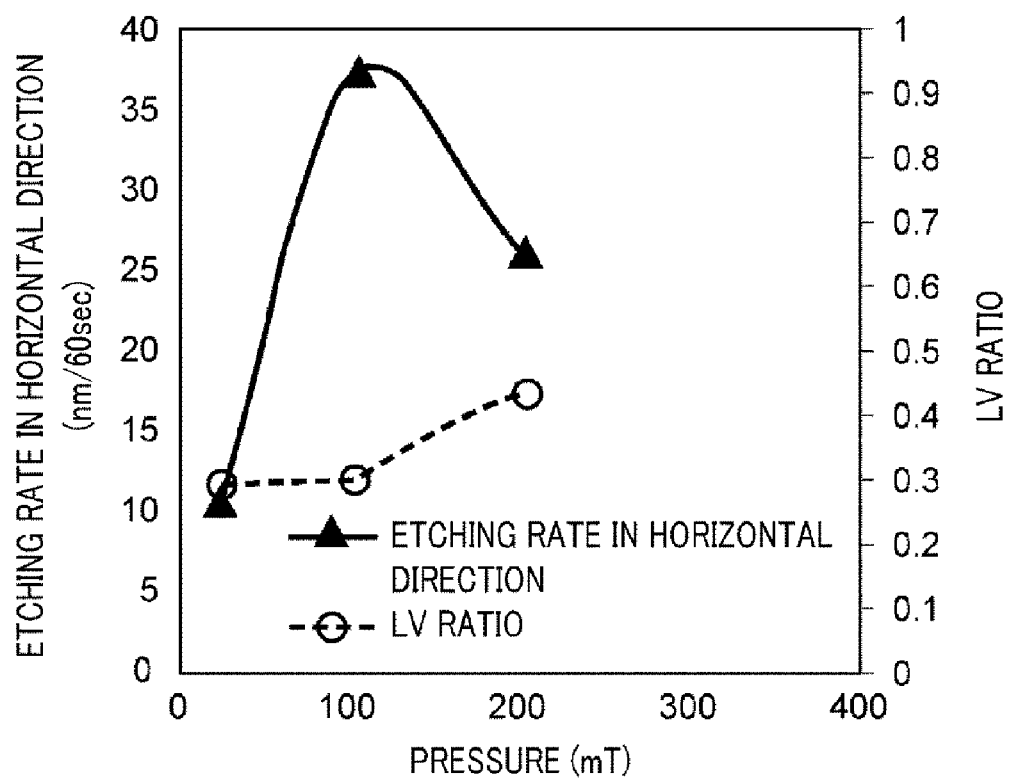
FIG. 21 is a graph showing a relationship between a pressure, an etching rate in a horizontal direction and a LV ratio.

(Processing Conditions at Block ST4 in Experimental Examples 14 to 16)
Microwave: about 2.45 MHz, about 3000 W
High frequency bias power: about 13.65 MHz, 0 W
Flow rate of $N_2$ gas: about 400 sccm
Flow rate of $Cl_2$ gas: about 240 sccm
Flow rate of $CF_4$ gas: about 12 sccm FIG. 20 illustrates shapes of recess regions of processing target objects W obtained by the experimental examples 14 to 16. FIG. 20 provides schematic diagrams of the recesses regions REC of the processing target objects W obtained by the experimental examples 14 to 16 and dimensions of those recess regions REC. As shown in FIG. 20, it is proved that a shape of a recess region REC can be controlled by performing the main etching process while varying the internal pressure of the processing chamber at block ST4. To elaborate, a recess region REC having a substantially circular cross sectional shape is formed in the processing target object W obtained by the experimental example 14. Meanwhile, a recess region REC having a shape, in which a sidewall surface thereof is substantially orthogonal to a bottom surface thereof, is formed in the processing target object W obtained by the experimental example 15. Further, a recess region REC having a shape, in which a sidewall surface is inclined against a bottom surface thereof, is formed in the processing target object W obtained by the experimental example 16. Further, from the result shown in FIG. 20, it is also found out that LV ratios of the recess regions REC tend to be improved as the internal pressure of the processing chamber at block ST4 increases. FIG. 21 is a graph showing a relationship between a pressure, an etching rate in a horizontal direction and a LV ratio. As can be seen from FIG. 21, the etching in the horizontal direction may not progress easily at a pressure lower than about 100 mT.

Experimental Examples 17 and 18

In experimental examples 17 and 18, a shape of a formed recess region and a selectivity against a mask are investigated while varying an internal pressure of the processing chamber at block ST4 of the plasma etching method in accordance with the example embodiment. To elaborate, in the experimental examples 17 and 18, a main etching process of block ST4 is performed by setting the internal pressure of the processing chamber to about 200 mT (about 26.66 Pa) and about 400 mT (about 53.32 Pa), respectively. Further, in the experimental examples 17 and 18, processing conditions at block ST2 and block ST3 as pre-treatment are set to be same, and the other processing conditions at block ST4 are as follows.

Figure 22A:
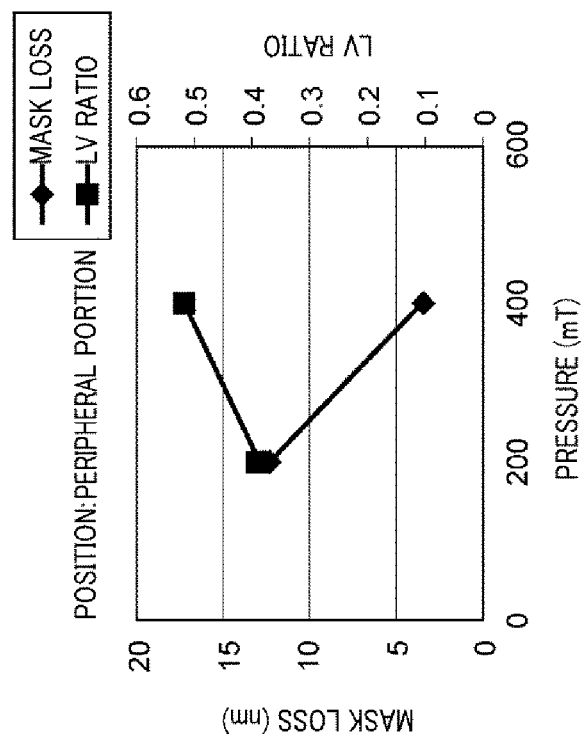
FIG. 22A and FIG. 22B are graphs showing LV ratios and mask losses in processing target objects obtained by experimental examples 17 and 18.
Figure 22B:
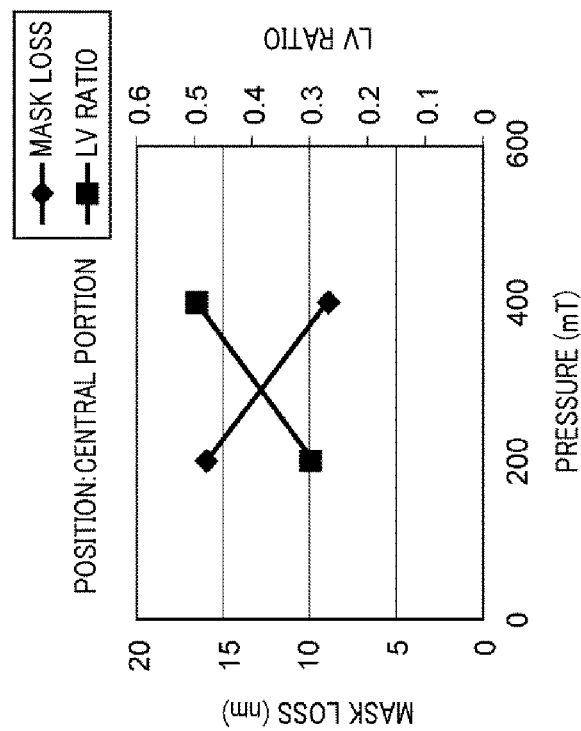

(Processing Conditions at Block ST4 in Experimental Examples 17 and 18)
Microwave: about 2.45 GHz, about 1000 W
High frequency bias power: about 13.65 MHz, 0 W
Flow rate of Ar gas: about 880 sccm
Flow rate of $CF_4$ gas: about 53 sccm
Processing time: about 40 sec Then, a shape of a recess region REC and a selectivity against a mask in each of the processing target objects W obtained by the experimental examples 17 and 18 is investigated. FIG. 22A and FIG. 22B are graphs showing a relationship between the internal pressure of the processing chamber, a LV ratio of the recess region REC and a mask loss at block ST4. Here, the mask loss refers to a thickness of a mask M removed by the etching at block ST4. FIG. 22A is a graph showing a LV ratio and a mask loss at a central portion of each processing target object W, and FIG. 22B is a graph showing a LV ratio and a mask loss at a peripheral portion of each processing target object W. As can be seen from FIG. 22A and FIG. 22B, by increasing the internal pressure from about 200 mT to about 400 mT, both the LV ratio and the selectivity against the mask M are found to be improved, so that the mask loss is reduced. As proved from the results shown in FIG. 20 to FIG. 22B, by setting the internal pressure of the processing chamber within the range from, e.g., about 100 mTorr to about 400 mTorr, it is possible to etch the etching target layer with a high selectivity against the mask, and it is also possible to improve a LV ratio.

Experimental Example 19

In an experimental example 19, there is investigated a shape of a recess region REC formed in case of changing a reactive gas at block ST4 of the plasma etching method in accordance with the example embodiment. To elaborate, in the experimental example 19, a main etching process of block ST4 is performed by adding a $Cl_2$ gas as a reactive gas into a processing gas without adding a $CF_4$ gas. Processing conditions for the experimental example 19 are as follows.

Figure 23:
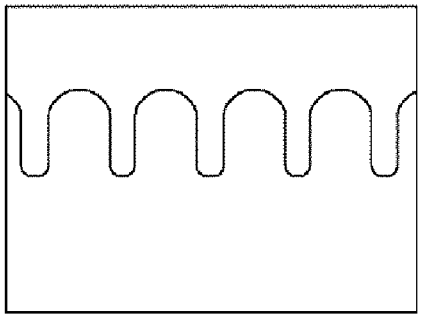
FIG. 23 is a diagram illustrating a shape of a recess region of a processing target object obtained by an experimental example 19.

(Processing Conditions in Experimental Example 19)
Internal pressure of the processing chamber 12: about 200 mT (about 26.66 Pa)
Microwave: about 2.45 MHz, about 3000 W
High frequency bias power: about 13.65 MHz, 0 W
Flow rate of $N_2$ gas: about 400 sccm
Flow rate of $Cl_2$ gas: about 240 sccm
Processing time: about 20 sec FIG. 23 is a diagram illustrating a shape of a recess region REC of a processing target object W obtained by the experimental example 19. FIG. 23 provides a schematic diagram of the recess region REC of the processing target object W obtained by the experimental example 19 and a LV ratio at the recess region REC. As can be seen from FIG. 23, when the main etching is performed by using the $Cl_2$ gas instead of the $CF_4$ gas as the reactive gas, the etching hardly progresses in the horizontal direction of the etching target layer.

Experimental Examples 20 and 21

In experimental examples 20 and 21, there is investigated a shape of an etching region while varying a flow rate ratio of a processing gas at block ST4 of the plasma etching apparatus in accordance with the example embodiment. To elaborate, in the experimental example 20, an Ar gas and a $CF_4$ gas are supplied into the processing chamber as a processing gas at a flow rate ratio of about 880:53. Meanwhile, in the experimental example 21, an Ar gas and a $CF_4$ gas are supplied into the processing chamber as a processing gas at a flow rate ratio of about 880:22. In the experimental examples 21 and 22, processing conditions at block ST2 and block ST3 as pre-treatment are set to be same, and the other processing conditions at block ST4 are as follows.

Figure 24A:
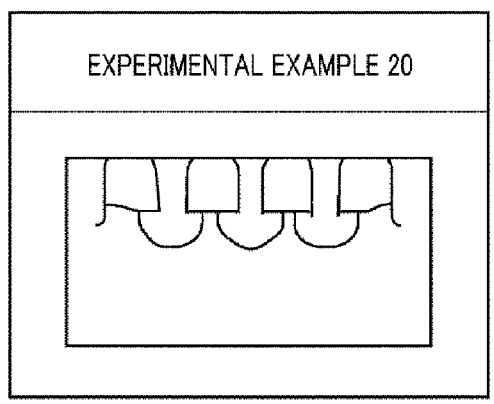
FIG. 24A and FIG. 24B are diagrams illustrating shapes of recess regions at central portions of processing target objects obtained by experimental examples 20 and 21.
Figure 24B:
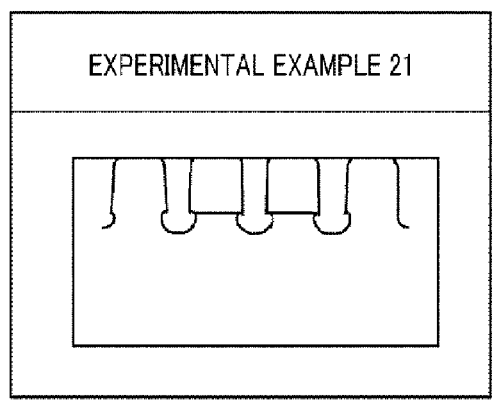

(Processing Conditions at Block ST4 in Experimental Examples 20 and 21)
Internal pressure of the processing chamber 12: about 200 mT (about 26.66 Pa)
Microwave: about 2.45 MHz, about 1000 W
High frequency bias power: about 13.65 MHz, 0 W
Processing time: about 30 sec FIG. 24A is a diagram illustrating a shape of a recess region REC at a central portion of a processing target object W obtained by the experimental example 20. FIG. 24B is a diagram illustrating a recess region REC at a central portion of a processing target object W obtained by the experimental example 21. As depicted in FIG. 24A and FIG. 24B, in the processing target object W obtained by the experimental example 21, the etching uniformity is lower than that of the processing target object W obtained by the experimental example 20. As proved from this result, by setting the flow rate ratio between the Ar gas and the $CF_4$ gas to about 880:53 at block ST4, it may be possible to etch the etching target layer with high uniformity. Further, it is also proved, though description of that experimental example is omitted here, that it is possible to improve uniformity of main etching in entire surface of the processing target object by increasing a total flow rate of a processing gas while maintaining the flow rate ratio between the Ar gas and the $CF_4$ gas.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:
1. A plasma etching method of etching an etching target layer containing silicon, the plasma etching method comprising:
exposing a processing target object having the etching target layer to an atmosphere to form a natural oxide film on a surface of the etching target layer;
transferring the processing target object having the etching target layer into a processing chamber;
removing the natural oxide film on the surface of the etching target layer by generating plasma of a first processing gas that contains a fluorocarbon gas or a fluorohydrocarbon gas but does not contain oxygen;
generating a carbon-based reaction product by removing the natural oxide film;
removing the carbon-based reaction product by generating plasma of a second processing gas that contains a chlorine and does not contain oxygen; and
etching the etching target layer using a high-density radical-dominant etching process without applying a high frequency bias power to a lower electrode serving as a mounting table configured to mount the processing target object thereon by generating plasma of a third processing gas containing a fluorocarbon gas or a fluorohydrocarbon gas with a microwave,
wherein the step of removing the natural oxide film, the step of generating the carbon-based reaction product, the step of removing the carbon-based reaction product and the step of etching the etching target layer are performed within said processing chamber.
2. The plasma etching method of claim 1,
wherein the processing target object includes the etching target layer and a dummy gate formed on the etching target layer, and
a part of the etching target layer located under the dummy gate is removed in the etching of the etching target layer.
3. The plasma etching method of claim 1,
wherein a microwave power ranging from about 1000 W to about 1500 W is applied in the etching of the etching target layer.
4. The plasma etching method of claim 1,
wherein an internal pressure of the processing chamber is set to be in the range from about 100 mTorr to about 400 mTorr in the etching of the etching target layer.
5. The plasma etching method of claim 1,
wherein the third processing gas contains Ar but does not contain $N_2$.

* * * * *